(12) United States Patent
Hashimoto et al.

(10) Patent No.: US 9,195,133 B2
(45) Date of Patent: Nov. 24, 2015

(54) MASK BLANK, TRANSFER MASK AND METHOD OF MANUFACTURING TRANSFER MASK

(71) Applicant: HOYA CORPORATION, Tokyo (JP)

(72) Inventors: Masahiro Hashimoto, Tokyo (JP); Atsushi Kominato, Tokyo (JP); Hiroyuki Iwashita, Tokyo (JP); Osamu Nozawa, Tokyo (JP)

(73) Assignee: HOYA CORPORATION, Tokyo (JP)

( * ) Notice: Subject to any disclaimer, the term of this patent is extended or adjusted under 35 U.S.C. 154(b) by 183 days.

(21) Appl. No.: 14/094,467

(22) Filed: Dec. 2, 2013

(65) Prior Publication Data

US 2014/0087292 A1 Mar. 27, 2014

Related U.S. Application Data

(62) Division of application No. 13/384,168, filed as application No. PCT/JP2010/061894 on Jul. 14, 2010, now Pat. No. 8,637,213.

(30) Foreign Application Priority Data

Jul. 16, 2009 (JP) .................................. 2009-167792

(51) Int. Cl.
*G03F 1/50* (2012.01)
*G03F 1/80* (2012.01)
*G03F 1/54* (2012.01)
*G03F 1/74* (2012.01)

(52) U.S. Cl.
CPC .. *G03F 1/50* (2013.01); *G03F 1/54* (2013.01); *G03F 1/80* (2013.01); *G03F 1/74* (2013.01)

(58) Field of Classification Search
CPC ..................................... G03F 1/50; G03F 1/80
USPC ............................................................. 430/5
See application file for complete search history.

(56) References Cited

U.S. PATENT DOCUMENTS

| | | | |
|---|---|---|---|
| 6,753,538 | B2 | 6/2004 | Musil et al. |
| 2007/0212618 | A1 | 9/2007 | Yoshikawa et al. |
| 2007/0212619 | A1 | 9/2007 | Yoshikawa et al. |
| 2007/0248897 | A1 | 10/2007 | Yoshikawa et al. |

FOREIGN PATENT DOCUMENTS

| | | |
|---|---|---|
| JP | 2000-10260 A | 1/2000 |
| JP | 2004-537758 A | 12/2004 |
| JP | 2006-237192 A | 9/2006 |
| JP | 2007-241060 A | 9/2007 |
| JP | 2007-241065 A | 9/2007 |
| JP | 2007-279441 A | 10/2007 |
| JP | 2007-292824 A | 11/2007 |
| JP | 2009-98369 A | 5/2009 |

OTHER PUBLICATIONS

International Search Report of PCT/JP2010/061894 dated Oct. 19, 2010.

*Primary Examiner* — Stephen Rosasco
(74) *Attorney, Agent, or Firm* — Sughrue Mion, PLLC

(57) ABSTRACT

Provided is a mask blank which enables EB defect correction to be suitably applied and which further enables a reduction in the thickness of a light-shielding film. A mask blank 10 is used for producing a transfer mask adapted to be applied with ArF exposure light and has a light-shielding film 2 on a transparent substrate 1. The light-shielding film 2 is composed mainly of a material containing a transition metal, silicon, and at least one or more elements selected from oxygen and nitrogen. An etching rate of the light-shielding film by a fluorine-containing substance in a state of not being irradiated with charged particles is low enough to at least ensure etching selectivity with respect to an etching rate of the light-shielding film by the fluorine-containing substance in a state of being irradiated with the charged particles.

29 Claims, 2 Drawing Sheets

MASK BLANK, TRANSFER MASK AND METHOD OF MANUFACTURING TRANSFER MASK

CROSS REFERENCE TO RELATED APPLICATIONS

This application is a Divisional of U.S. application Ser. No. 13/384,168, filed Apr. 3, 2012, which is a §371 National Stage Application of International Application No. PCT/JP2010/061894 filed Jul. 14, 2010, which claims priority based on Japanese Patent Application No. 2009-167792 filed Jul. 16, 2009, the contents of all of which are incorporated herein by reference in their entirety.

TECHNICAL FIELD

This invention relates to a mask blank and a transfer mask. In particular, this invention relates to a mask blank for manufacturing a transfer mask to which a defect correction technique using charged particle irradiation can be suitably applied.

BACKGROUND ART

Generally, fine pattern formation is carried out by the photolithography in manufacturing processes of a semiconductor device. A number of substrates called transfer masks (photomasks) are normally used for this fine pattern formation. The transfer mask comprises generally a transparent glass substrate having thereon a fine pattern made of a metal thin film or the like. The photolithography is used also in the manufacture of the transfer mask.

In the manufacture of a transfer mask by the photolithography, use is made of a mask blank having a thin film (e.g. a light-shielding film or the like) for forming a transfer pattern (mask pattern) on a transparent substrate such as a glass substrate. The manufacture of the transfer mask using the mask blank comprises an exposure process of applying required pattern writing to a resist film formed on the mask blank, a developing process of developing the resist film according to the required pattern writing to form a resist pattern, an etching process of etching the thin film according to the resist pattern, and a process of stripping and removing the remaining resist pattern. In the developing process, a developer is supplied after applying the required pattern writing to the resist film formed on the mask blank to dissolve a portion of the resist film soluble in the developer, thereby forming the resist pattern. In the etching process, using this resist pattern as a mask, an exposed portion of the thin film, where the resist pattern is not formed, is dissolved by dry etching or wet etching, thereby forming a required mask pattern on the transparent substrate. In this manner, the transfer mask is produced.

For miniaturization of a pattern of a semiconductor device, it is necessary to shorten the wavelength of an exposure light source for use in the photolithography in addition to the miniaturization of the mask pattern formed in the transfer mask. In recent years, the wavelength of an exposure light source in the manufacture of a semiconductor device has been shortened from a KrF excimer laser (wavelength 248 nm) to an ArF excimer laser (wavelength 193 nm).

As a type of transfer mask, apart from a conventional binary mask having a light-shielding film pattern made of a chromium-based material on a transparent substrate, there has appeared in recent years a binary mask or the like using, as a light-shielding film, a material such as MoSiN containing a transition metal and silicon as main metal components and further containing nitrogen, as described in Patent Document 1.

In the meantime, hitherto, with respect to a transfer mask manufactured from a mask blank by forming a transfer pattern in a light-shielding film by dry etching using as a mask a resist pattern formed in a resist film by electron beam writing and development or an etching mask pattern formed in an etching mask film, a comparison is made, using a pattern inspection apparatus, between a design transfer pattern and the transfer pattern formed in the light-shielding film and a defect (so-called black defect) portion where the light-shielding film remains in excess as compared with the design transfer pattern is corrected by a physical treatment using nano-machining or focused ion beam FIB (Focused Ion Beam). However, there has been a problem that the black defect correction by such a physical treatment takes much time. Further, since the irradiation dose of Ga ions becomes large in the normal FIB treatment, Ga stain remaining on a QZ substrate has been a problem. In view of this, there has been reported a technique of gas assist or the like for enhancing the reactivity to suppress the Ga irradiation dose (see Patent Document 2).

On the other hand, Patent Document 3 discloses a defect correction technique that supplies a xenon difluoride ($XeF_2$) gas to a black defect portion of a light-shielding film and further irradiates an electron beam onto the black defect portion, thereby etching the black defect portion to remove it (hereinafter, such defect correction that is carried out by irradiating charged particles such as an electron beam will be referred to simply as EB defect correction). Such EB defect correction was at first used for correction of a black defect portion in an absorber film of a reflective mask for EUV lithography, but has started to be used also for defect correction of a MoSi-based halftone mask.

PRIOR ART DOCUMENT

Patent Document

Patent Document 1: JP-A-2007-292824
Patent Document 2: JP-A-2000-10260
Patent Document 3: JP-A-2004-537758

SUMMARY OF THE INVENTION

Problem to be Solved by the Invention

Using a binary mask blank formed with a light-shielding film of a laminated structure made of materials each containing a transition metal and silicon as main metal components and further containing nitrogen as disclosed in Patent Document 1, the present inventors produced a transfer mask formed with a transfer pattern in the light-shielding film, performed a defect inspection of the produced transfer mask, and performed EB defect correction of a black defect portion as disclosed in Patent Document 3, i.e. performed etching of the black defect portion by supplying a $XeF_2$ gas to the black defect portion and irradiating charged particles such as electrons onto the black defect portion. As a result, it has been found that the following problems may occur depending on the relationship between the film compositions of the light-shielding film.

The $XeF_2$ gas is known as an isotropic etching gas for silicon and its mechanism is such that etching proceeds in processes of surface adsorption, separation into Xe and F, and production and volatilization of a high-order fluoride of silicon. Normally, when carrying out EB defect correction, a fluorine-containing substance such as a $XeF_2$ gas is supplied in a fluid state (particularly in a gaseous state) to a black defect portion. As a consequence, the fluorine-containing substance such as the $XeF_2$ gas is also brought into contact with other than the black defect portion. If silicon as a component forming a light-shielding film is in the form of nitrided, oxidized, or carbonized silicon such as $Si_3N_4$, $SiO_2$, SiON, or SiC, it does not easily form a highly volatile high-order fluoride and thus has high etching resistance to the fluorine-based gas such as the $XeF_2$ gas. However, in the case of silicon which is not in the state of being bonded to the other element as described above, it is easily etched by the fluorine-based gas such as the $XeF_2$ gas. Accordingly, there has been a problem that when a material in which the ratio of non-bonded silicon is high is used a light-shielding film, even a portion which should not primarily be etched is etched to thereby cause a new defect.

Generally, in order to suppress the surface reflection of a light-shielding film, the surface reflectance of the light-shielding film is reduced by setting the degree of oxidation or nitridation of a material of a layer on the surface side (upper layer) to be higher than that of a material of a layer on the substrate side (lower layer). On the other hand, in a binary mask blank, a light-shielding film is required to have a predetermined or higher light-shielding performance (e.g. an optical density (OD) of 2.8 or more). As the degree of oxidation or nitridation of a material increases, the light-shielding performance tends to decrease. In the meantime, due to the miniaturization of a transfer pattern in recent years, it has become necessary to use an oblique illumination method or an immersion exposure method. However, this has caused a problem of the influence of the shadowing effect (shadowing) and, in order to reduce this influence, a reduction in the thickness of the light-shielding film has become necessary. Therefore, it is necessary to minimize the degree of oxidation or nitridation in the layer on the substrate side (lower layer) in order to ensure the light-shielding performance with as small a thickness as possible. In the lower layer of the light-shielding film, the degree of oxidation or nitridation is lower than that in the upper layer and thus the content of non-bonded silicon is higher. As a consequence, the influence of etching due to the fluorine-based gas such as the $XeF_2$ gas is significant so that a level difference occurs between the upper and lower layers. In an extreme case, a large undercut is formed.

Therefore, this invention has been made in order to solve the conventional problems and has an object to provide a mask blank and a transfer mask, which enable EB defect correction to be suitably applied and which further enable a reduction in the thickness of a light-shielding film.

Means for Solving the Problem

The present inventors have made an intensive study on the problems which arise when the EB defect correction is applied for correction of the black defect portion with respect to the transfer mask which is formed with the transfer pattern in the light-shielding film using the conventional binary mask blank having the light-shielding film of the laminated structure made of the materials each containing the transition metal and silicon as the main metal components and further containing nitrogen.

As a result of studying various materials, the present inventors have found that, in a mask blank comprising a light-shielding film composed mainly of a material containing a transition metal, silicon, and at least one or more elements selected from oxygen and nitrogen, it is possible to solve the problems which arise when the conventional EB defect correction is applied, and further to achieve a reduction in the thickness of the light-shielding film by adjusting, in a predetermined range, the relationship between an etching rate of the light-shielding film by a fluorine-containing substance in a state of not being irradiated with charged particles and an etching rate of the light-shielding film by the fluorine-containing substance in a state of being irradiated with the charged particles.

As a result of further continuing intensive studies based on the elucidated fact and consideration described above, the present inventors have completed this invention.

Specifically, in order to solve the above-mentioned problems, this invention has the following structures.

(Structure 1)

A mask blank adapted to manufacture a transfer mask applied with ArF excimer laser exposure light, comprising:
a transparent substrate; and
a light-shielding film formed on the transparent substrate, the
light-shielding film serving to form a transfer pattern;
wherein the light-shielding film is composed mainly of a material containing a transition metal, silicon, and at least one or more elements selected from oxygen and nitrogen, and
wherein an etching rate of the light-shielding film by a fluorine-containing substance in a state of not being irradiated with charged particles is low enough to at least ensure etching selectivity with respect to an etching rate of the light-shielding film by the fluorine-containing substance in a state of being irradiated with the charged particles.

(Structure 2)

The mask blank according to structure 1, wherein the etching rate of the light-shielding film by the fluorine-containing substance in the state of not being irradiated with the charged particles is 0.3 nm/sec or less.

(Structure 3)

The mask blank according to structure 1 or 2, wherein the light-shielding film has an at least two-layer structure of a lower layer and an upper layer.

(Structure 4)

The mask blank according to structure 3, wherein a total content of the nitrogen and the oxygen in the lower layer is 40 at % or less.

(Structure 5)

The mask blank according to structure 3 or 4, wherein a ratio obtained by dividing a content of the transition metal in the lower layer by a total content of the transition metal and the silicon in the lower layer is 6% or more.

(Structure 6)

The mask blank according to structure 3 or 4, wherein a ratio obtained by dividing a content of the transition metal in the lower layer by a total content of the transition metal and the silicon in the lower layer is 15% or more.

(Structure 7)

The mask blank according to any one of structures 3 to 6, wherein a total content of the nitrogen and the oxygen in the upper layer is 30 at % or more.

(Structure 8)

The mask blank according to any one of structures 3 to 7, wherein a content of the transition metal in the upper layer is 10 at % or less.

(Structure 9)

The mask blank according to any one of structures 1 to 8, wherein the light-shielding film has a thickness of less than 65 nm.

(Structure 10)

The mask blank according to any one of structures 3 to 9, wherein the upper layer has a thickness of 5 nm or more and 20 nm or less.

(Structure 11)

The mask blank according to any one of structures 1 to 10, wherein an etching mask film is provided on an upper surface of the light-shielding film and contains chromium and at least one of nitrogen and oxygen, a content of the chromium in the etching mask film is less than 50 at %, and a thickness of the etching mask film is 5 nm or more and 20 nm or less.

(Structure 12)

The mask blank according to structure 1, wherein a ratio obtained by dividing a content of the transition metal in the light-shielding film by a total content of the transition metal and the silicon in the light-shielding film and a content of the nitrogen in the light-shielding film are in ranges satisfying a condition of a formula (1) given by $$C_N \geq -0.00526 C_{Mo}^2 - 0.640 C_{Mo} + 26.624$$

where $C_{Mo}$ is the ratio obtained by dividing the content of the transition metal by the total content of the transition metal and the silicon and $C_N$ is the content of the nitrogen.

(Structure 13)

The mask blank according to structure 1, wherein a ratio obtained by dividing a content of the transition metal in the light-shielding film by a total content of the transition metal and the silicon in the light-shielding film and a content of the nitrogen in the light-shielding film are in ranges satisfying a condition of a formula (2) given by $$C_N \geq -0.00351 C_{Mo}^2 - 0.393 C_{Mo} + 32.086$$

where $C_{Mo}$ is the ratio obtained by dividing the content of the transition metal by the total content of the transition metal and the silicon and $C_N$ is the content of the nitrogen.

(Structure 14)

The mask blank according to structure 12 or 13, wherein the ratio obtained by dividing the content of the transition metal in the light-shielding film by the total content of the transition metal and the silicon in the light-shielding film and the content of the nitrogen in the light-shielding film are in ranges simultaneously satisfying a condition of a formula (3) given by $$C_N \leq 2.97 \times 10^{-8} C_{Mo}^6 - 5.22 \times 10^{-6} C_{Mo}^5 + 3.39 \times 10^{-4} C_{Mo}^4 - 9.35 \times 10^{-3} C_{Mo}^3 + 4.19 \times 10^{-2} C_{Mo}^2 + 2.470 C_{Mo} + 9.531$$

where $C_{Mo}$ is the ratio obtained by dividing the content of the transition metal by the total content of the transition metal and the silicon and $C_N$ is the content of the nitrogen.

(Structure 15)

The mask blank according to structure 12 or 13, wherein the ratio obtained by dividing the content of the transition metal in the light-shielding film by the total content of the transition metal and the silicon in the light-shielding film and the content of the nitrogen in the light-shielding film are in ranges simultaneously satisfying a condition of a formula (4) given by $$C_N \leq -3.63 \times 10^{-7} C_{Mo}^5 + 7.60 \times 10^{-5} C_{Mo}^4 - 4.67 \times 10^{-3} C_{Mo}^3 + 5.06 \times 10^{-2} C_{Mo}^2 + 2.082 C_{Mo} + 1.075$$

where $C_{Mo}$ is the ratio obtained by dividing the content of the transition metal by the total content of the transition metal and the silicon and $C_N$ is the content of the nitrogen.

(Structure 16)

The mask blank according to any of structures 12 to 15, wherein the ratio obtained by dividing the content of the transition metal in the light-shielding film by the total content of the transition metal and the silicon in the light-shielding film and the content of the nitrogen in the light-shielding film are in ranges simultaneously satisfying a condition of a formula (5) given by $$C_N \leq 2.593 C_{Mo} - 24.074$$

where $C_{Mo}$ is the ratio obtained by dividing the content of the transition metal by the total content of the transition metal and the silicon and $C_N$ is the content of the nitrogen.

(Structure 17)

A transfer mask manufactured using the mask blank according to any one of structures 1 to 16.

(Structure 18)

A transfer mask adapted to be applied with ArF excimer laser exposure light, comprising;

a transparent substrate;

a light-shielding film formed on the transparent substrate, the light-shielding film having a transfer pattern;

wherein the light-shielding film is composed mainly of a material containing a transition metal, silicon, and at least one or more elements selected from oxygen and nitrogen, and wherein an etching rate of the light-shielding film by a fluorine-containing substance in a state of not being irradiated with charged particles is low enough to at least ensure etching selectivity with respect to an etching rate of the light-shielding film by the fluorine-containing substance in a state of being irradiated with the charged particles.

(Structure 19)

The transfer mask according to structure 18, wherein the etching rate of the light-shielding film by the fluorine-containing substance in the state of not being irradiated with the charged particles is 0.3 nm/sec or less.

Effect of the Invention

According to this invention, by forming a light-shielding film composed mainly of a material containing a transition metal, silicon, and at least one or more elements selected from oxygen and nitrogen and by adjusting, in a predetermined range, the relationship between an etching rate of the light-shielding film by a fluorine-containing substance in a state of not being irradiated with charged particles and an etching rate of the light-shielding film by the fluorine-containing substance in a state of being irradiated with the charged particles, it is possible to provide a mask blank and a transfer mask, which can solve the problems that arise when the conventional EB defect correction is applied, and which, as a result, enable the EB defect correction to be suitably applied to black defect correction of a transfer pattern.

Further, according to this invention, it is possible to provide a mask blank and a transfer mask, which can achieve an optical density of a light-shielding film, required for a binary mask, with a thickness of, for example, less than 65 nm and thus can solve the problem due to shadowing.

MODE FOR CARRYING OUT THE INVENTION

Hereinbelow, an embodiment of this invention will be described in detail with reference to the drawings.

This invention is a mask blank for use in the manufacture of a transfer mask adapted to be applied with ArF exposure light, the mask blank comprising, on a transparent substrate, a light-shielding film for forming a transfer pattern, wherein the light-shielding film is composed mainly of a material containing a transition metal, silicon, and at least one or more elements selected from oxygen and nitrogen and wherein an etching rate of the light-shielding film by a fluorine-containing substance in a state of not being irradiated with charged particles is low enough to at least ensure etching selectivity with respect to an etching rate of the light-shielding film by the fluorine-containing substance in a state of being irradiated with the charged particles.

Figures 1, 2:
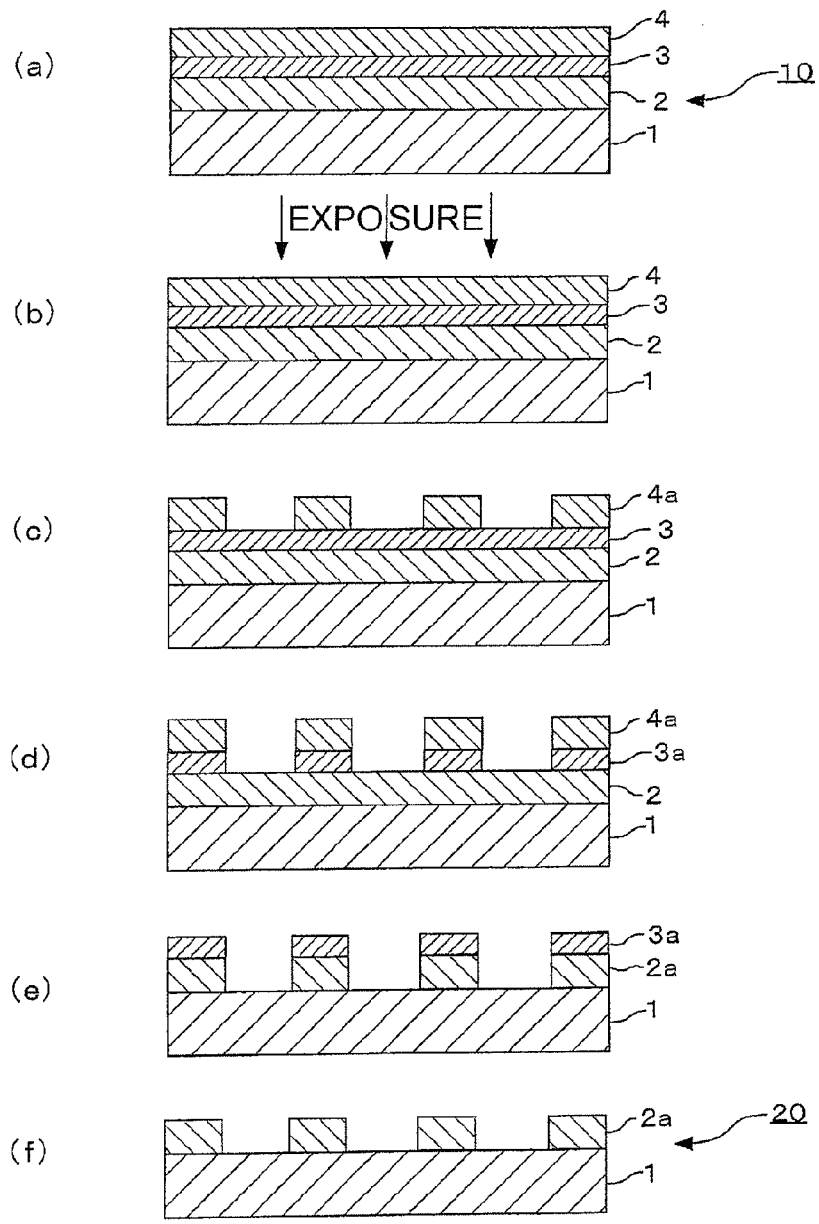
FIG. 1 is a cross-sectional view of an embodiment of a mask blank according to this invention.
FIG. 2 is cross-sectional views showing processes of manufacturing a transfer mask using the embodiment of the mask blank according to this invention.

FIG. 1 is a cross-sectional view of a mask blank according to this invention. As shown in FIG. 1, a mask blank 10 according to the embodiment of this invention comprises a light-shielding film 2 on a transparent substrate 1. The transparent substrate 1 is not particularly limited as long as it has transparency for ArF excimer laser. In this invention, a synthetic quartz substrate and various other glass substrates can be used. Among them, the synthetic quartz substrate is particularly suitable for this invention because it has high transparency for ArF excimer laser.

The light-shielding film of this embodiment is composed mainly of a material containing a transition metal, silicon, and at least one or more elements selected from oxygen and nitrogen, wherein an etching rate of the light-shielding film by a fluorine-containing substance in a state of not being irradiated with charged particles such as an electron beam should be low enough to at least ensure etching selectivity with respect to an etching rate of the light-shielding film by the fluorine-containing substance in a state of being irradiated with the charged particles. If sufficient etching selectivity cannot be ensured between the etching rate of the light-shielding film by the fluorine-containing substance in the state of not being irradiated with the charged particles and the etching rate of the light-shielding film by the fluorine-containing substance in the state of being irradiated with the charged particles, there arises a problem that even a portion which does not require correction is also etched due to exposure to the fluorine-containing substance in EB defect correction. When the light-shielding film has an at least two-layer structure of a lower layer and an upper layer, an unwanted level difference or undercut is formed.

Until EB defect correction is finished after the fluorine-containing substance in an unexcited state (non-plasma state) is supplied to a correction target portion of the light-shielding film, even if a portion other than the correction target portion of the light-shielding film is exposed to the fluorine-containing substance in the state of not being irradiated with the charged particles, the portion other than the correction target portion of the light-shielding film should not be etched to thereby prevent the influence on the optical properties, the line edge roughness, the CD accuracy, and so on. For this, the etching rate of the light-shielding film by the fluorine-containing substance in the state of not being irradiated with the charged particles should be sufficiently lower than the etching rate of the light-shielding film by the fluorine-containing substance in the state of being irradiated with the charged particles.

Taking this point into account, in this invention, it is preferable to have a sufficient etching selectivity of, for example, 1:5 or more between the etching rate of the light-shielding film by the fluorine-containing substance in the state of not being irradiated with the charged particles and the etching rate of the light-shielding film by the fluorine-containing substance in the state of being irradiated with the charged particles. In particular, 1:10 or more is desirable.

When the light-shielding film has the at least two-layer structure of the lower layer and the upper layer, the fluorine-containing substance is brought into contact with the upper layer in an area greater than that of the lower layer in EB defect correction. Taking this point also into account, it is optimal to configure such that etching rates become lower in the order of the etching rate of the lower layer by the fluorine-containing substance in the state of being irradiated with the charged particles, the etching rate of the upper layer by the fluorine-containing substance in the state of being irradiated with the charged particles, the etching rate of the lower layer by the fluorine-containing substance in the state of not being irradiated with the charged particles, and the etching rate of the upper layer by the fluorine-containing substance in the state of not being irradiated with the charged particles.

In this invention, even when the light-shielding film has the at least two-layer structure of the lower layer and the upper layer, it is preferable to have a sufficient etching selectivity of, for example, 1:5 or more between the etching rate of the lower layer by the fluorine-containing substance in the state of not being irradiated with the charged particles and the etching rate of the lower layer by the fluorine-containing substance in the state of being irradiated with the charged particles. In particular, 1:10 or more is desirable. This also applies to the upper layer.

As described above, the fluorine-containing substance is brought into contact with the upper layer of the light-shielding film in the area greater than that of the lower layer thereof in the EB defect correction. Taking this point into account, it is preferable that there be no extreme etching rate difference between the etching rates of the upper and lower layers by the fluorine-containing substance in the state of not being irradiated with the charged particles. For example, it is preferable to have an etching selectivity in a range of 1:1 to 1:5. In particular, 1:1 to 1:3 is desirable.

As the fluorine-containing substance which is supplied to the target portion (black defect portion) in the EB defect correction, use can be made of $XeF_2$, $XeF_4$, $XeF_6$, $XeOF_2$, $XeOF_4$, $XeO_2F_2$, $XeO_3F_2$, $XeO_2F_4$, $ClF_3$, $ClF$, $BrF_5$, $BrF$, $IF_3$, $IF_5$, $KrF$, $ArF$, or the like. In particular, $XeF_2$ is optimal. Such a substance is preferably supplied in a gaseous state to the target portion.

In order to satisfy the etching selectivity described above, it is preferable that the etching rate of the light-shielding film by the fluorine-containing substance in the state of not being irradiated with the charged particles be low. The etching rate can be lowered to a degree by adjusting a process of supplying the fluorine-containing substance to an EB correction portion using an EB defect correction apparatus, by skillfully using a passivation technique, or the like. However, even if it is carried out, the etching rate of the light-shielding film by the fluorine-containing substance in the state of not being irradiated with the charged particles should be set to at most 0.3 nm/sec or less. For adaptation to an EB defect correction apparatus which cannot use the passivation technique, or the like, it should be 0.2 nm/sec or less and more preferably 0.1 nm/sec or less.

Figure 3:
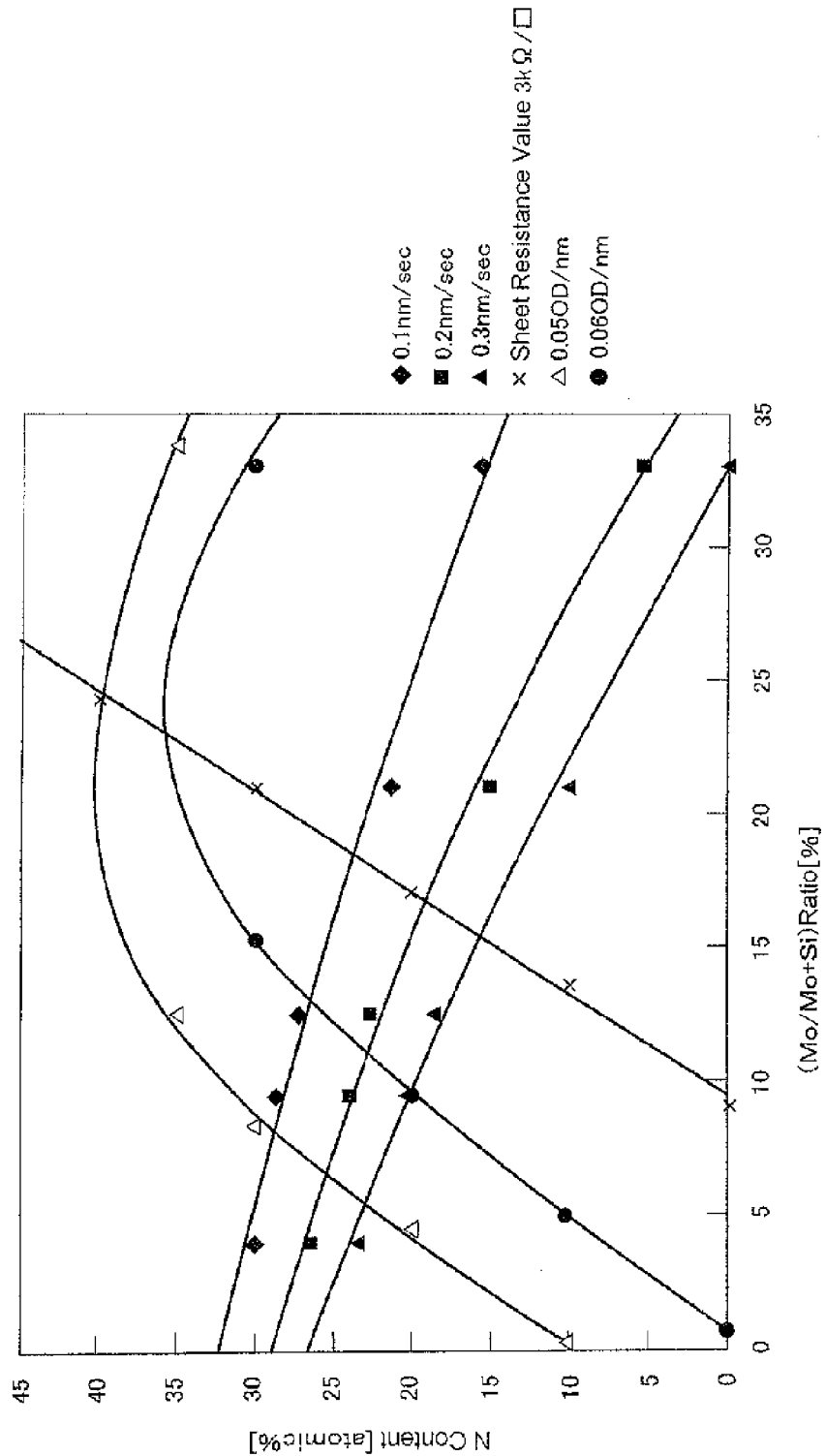
FIG. 3 is a diagram showing the relationship between the (Mo/Mo+Si) ratio and the nitrogen content, which satisfies a predetermined etching rate of a thin film by a fluorine-containing substance.

In FIG. 3, the ratios, each obtained by dividing the molybdenum content [at %] by the molybdenum and silicon total content [at %] in a thin film containing molybdenum, silicon, and nitrogen (i.e. the ratio, given in %, of the molybdenum content [at %] in a light-shielding film when the molybdenum and silicon total content [at %] in the light-shielding film is given as 100; hereinafter referred to as a (Mo/Mo+Si) ratio), and the nitrogen contents of light-shielding films whose etching rates by the fluorine-containing substance in the state of not being irradiated with the charged particles are predetermined values (0.3 nm/sec, 0.2 nm/sec, 0.1 nm/sec) are plotted and approximate curves are respectively drawn on the corresponding plots. In FIG. 3, for example, a region above and including the 0.3 nm/sec approximate curve (approximate curve of "▲0.3 nm/sec" plots) represents a composition range where a light-shielding film whose etching rate by the fluorine-containing substance in the state of not being irradiated with the charged particles is 0.3 nm/sec or less can be formed. That is, by forming the light-shielding film having the (Mo/Mo+Si) ratio and the nitrogen content in the ranges shown in FIG. 3, it is possible to satisfy the condition that the etching rate by the fluorine-containing substance in the state of not being irradiated with the charged particles is 0.3 nm/sec or less. This approximate curve formula is, for example, $C_N=-0.00526C_{Mo}^2-0.640C_{Mo}+26.624$, where $C_{Mo}$ is the (Mo/Mo+Si) ratio in the light-shielding film and $C_N$ is the nitrogen content in the light-shielding film.

Also in the case of a light-shielding film whose etching rate by the fluorine-containing substance in the state of not being irradiated with the charged particles is 0.2 nm/sec or less, it is necessary to satisfy the condition of a composition range in a region above and including the 0.2 nm/sec approximate curve (approximate curve of "■0.2 nm/sec" plots) shown in FIG. 3. This approximate curve formula is, for example, $C_N=-0.00733C_{Mo}^2-0.472C_{Mo}+28.885$. Further, also in the case of a light-shielding film whose etching rate by the fluorine-containing substance in the state of not being irradiated with the charged particles is 0.1 nm/sec or less, it is necessary to satisfy the condition of a composition range in a region above and including the 0.1 nm/sec approximate curve (approximate curve of "♦0.1 nm/sec" plots) shown in FIG. 3. This approximate curve formula is, for example, $C_N=-0.00351C_{Mo}^2-0.393C_{Mo}+32.086$.

These approximate curve formulas are each calculated based on the five plots in the figure and thus more or less change depending on a calculation method. However, the influence upon etching rates due to the movement of boundary lines of composition ratios satisfying certain etching rates caused by such a change of the approximate curve formula is small in an allowable range (the same shall apply to approximate curves and an approximate straight line given below). In FIG. 3, the ordinate axis represents the nitrogen content in the light-shielding film. Even if the required nitrogen content in the light-shielding film is defined as a value of the total content of nitrogen and oxygen, the etching rate of the light-shielding film by the fluorine-containing substance in the state of not being irradiated with the charged particles is approximately the predetermined value of less and there arises no problem.

In a thin film containing a transition metal such as molybdenum and silicon, the tendencies of change in etching rate with respect to the content of oxygen or nitrogen in the thin film differ between the case of etching by a fluorine-containing substance in a state of not being irradiated with charged particles and the case of etching by a fluorine-based gas in a plasma state, i.e. normal dry etching. The etching rate by the fluorine-containing substance in the state of not being irradiated with the charged particles tends to largely decrease as the oxygen or nitrogen content in the thin film increases, i.e. as the presence of silicon oxide or nitride in the thin film increases. On the other hand, in the case of the normal dry etching by the fluorine-based gas plasma, even if the oxygen or nitrogen content in the thin film increases, the etching rate does not substantially change or the etching rate tends to increase depending on the transition metal content. Therefore, the tendency of the etching rate in the case of the dry etching by the fluorine-based gas in the plasma state for the thin film containing the transition metal and silicon is difficult to use as reference.

In order to set the front-surface reflectance of the light-shielding film 2 to a predetermined value (e.g. 30%) or less, it is necessary that the light-shielding film 2 have an at least two-layer structure of a lower layer and an upper layer and that the upper layer be provided with a front-surface antireflection function, wherein the total content of nitrogen and oxygen in the upper layer (front-surface antireflection layer) is preferably 30 at % or more. In terms of reducing the thickness of the entire light-shielding film, the total content of nitrogen and oxygen in the upper layer is preferably 60 at % or less. Assuming that numerical values of the nitrogen content on the ordinate axis in FIG. 3 are directly substituted for the total content of nitrogen and oxygen, if the total content of nitrogen and oxygen in the upper layer is set to 30 at % or more for providing the upper layer with the front-surface antireflection function, the etching rate of the upper layer by the fluorine-containing substance in the state of not being irradiated with the charged particles becomes 0.2 nm/sec or less regardless of the (Mo/Mo+Si) ratio. Further, if the (Mo/Mo+Si) ratio is 4% or more, it becomes 0.1 nm/sec or less and thus becomes better.

In the case of oxygen, the degree of reduction in the extinction coefficient relative to its content in the layer is greater as compared with nitrogen and thus the transmittance of the upper layer for exposure light can be more enhanced so that it is possible to more reduce the front-surface reflectance. The oxygen content in the upper layer is preferably 10 at % or more and more preferably 15 at % or more. On the other hand, the nitrogen content in the upper layer is preferably 10 at % or more, but in order to reduce the front-surface reflectance while somewhat suppressing the oxygen content in the upper layer for the purpose of reducing the thickness of the light-shielding film, the nitrogen content is preferably 15 at % or more and more preferably 20 at % or more.

As the transition metal contained in the material of the upper layer, use can be made of molybdenum, tantalum, tungsten, titanium, chromium, hafnium, nickel, vanadium, zirconium, ruthenium, rhodium, niobium, palladium, or the like. Among them, molybdenum is preferable. The transition metal content in the upper layer is preferably 10 at % or less. If the transition metal content in the upper layer is greater than 10 at %, when a transfer mask is manufactured from this mask blank, the resistance to mask cleaning (alkaline cleaning with an ammonia hydrogen peroxide mixture, or hot water cleaning) is low so that there is a possibility of the occurrence of a change in optical properties (an increase in front-surface reflectance) due to dissolution of the upper layer or a degradation in line edge roughness or CD accuracy due to a change in the shape of a transfer pattern edge portion. This tendency is particularly significant when molybdenum is used as the transition metal in the upper layer. In particular, in the case where molybdenum is used as the transition metal in the upper layer, when a heat treatment (annealing) is carried out at a high temperature for the stress control of the light-shielding film, if the transition metal content of the upper layer (front-surface antireflection layer) is high, there occurs a phenomenon that the surface is clouded white (becomes cloudy). This is considered to be because MoO is precipitated on the surface. In order to also suppress such a phenomenon, the transition metal content of the upper layer is preferably 10 at % or less.

In the light-shielding film 2 with the upper layer having the front-surface antireflection function as described above, the upper layer has a low optical density and thus cannot contribute much to the optical density of the entire light-shielding film. Taking these into account, the optical density required for the light-shielding film 2 should be substantially ensured by the lower layer. In order to ensure most of the optical density of the entire light-shielding film by the lower layer, the optical density (OD) per unit thickness of a material of the lower layer should be 0.05 nm$^{-1}$ (wavelength: 193 nm) or more and is preferably 0.06 nm$^{-1}$ (wavelength: 193 nm) or more. FIG. 3 shows approximate curves obtained by plotting the (Mo/Mo+Si) ratios and the nitrogen contents of light-shielding films (lower layers) whose optical densities per unit thickness are predetermined values (0.05 nm$^{-1}$, 0.06 nm$^{-1}$). In FIG. 3, for example, a region below and including the 0.05 nm$^{-1}$ approximate curve (approximate curve of "Δ0.05 OD/nm" plots) represents a composition range where a light-shielding film (lower layer) with an optical density of 0.05 nm$^{-1}$ or more can be formed. This approximate curve formula is, for example, $C_N=2.97\times10^{-8}C_{Mo}^6-5.22\times10^{-6}C_{Mo}^5+3.39\times10^{-4}C_{Mo}^4-9.35\times10^{-3}C_{Mo}^3+4.19\times10^{-2}C_{Mo}^2+2.470C_{Mo}+9.531$.

With respect also to the (Mo/Mo+Si) ratio and the nitrogen content that can form a light-shielding film (lower layer) with an optical density of 0.06 nm$^{-1}$ or more per unit thickness, it is necessary to satisfy the condition of a composition range in a region below and including the 0.06 nm$^{-1}$ approximate curve (approximate curve of "●0.06 OD/nm" plots) shown in FIG. 3. This approximate curve formula is, for example, $C_N=-3.63\times10^{-7}C_{Mo}^4+7.60\times10^{-5}C_{Mo}^4-4.67\times10^{-3}C_{Mo}^3+5.06\times10^{-2}C_{Mo}^2+2.082C_{Mo}+1.075$. These approximate curve formulas are each calculated based on the five plots in the figure and thus more or less change depending on a calculation method. However, the influence upon optical densities due to the movement of boundary lines of composition ratios satisfying certain optical densities caused by such a change of the approximate curve formula is small in an allowable range.

From the approximate curve in FIG. 3, it is seen that, in order to form the light-shielding film (lower layer) with the optical density of 0.05 nm$^{-1}$ or more per unit thickness, the total content of nitrogen and oxygen should be at most 40 at % or less. In order to simultaneously satisfy the condition that the etching rate of the light-shielding film by the fluorine-containing substance in the state of not being irradiated with the charged particles becomes 0.3 nm/sec or less, the (Mo/Mo+Si) ratio should be 6% or more. Further, in order to satisfy also the condition that the etching rate of the same becomes 0.2 nm/sec or less, the (Mo/Mo+Si) ratio should be 7% or more and, in order to satisfy also the condition that the etching rate of the same becomes 0.1 nm/sec or less, the (Mo/Mo+Si) ratio should be 8% or more.

From the approximate curve in FIG. 3, it is seen that, in order to form the light-shielding film (lower layer) with the optical density of 0.06 nm-1 or more per unit thickness, the total content of nitrogen and oxygen should be at most 35 at % or less. In order to simultaneously satisfy the condition that the etching rate of the light-shielding film by the fluorine-containing substance in the state of not being irradiated with the charged particles becomes 0.3 nm/sec or less, the (Mo/Mo+Si) ratio should be 9% or more. Further, in order to satisfy also the condition that the etching rate of the same becomes 0.2 nm/sec or less, the (Mo/Mo+Si) ratio should be 11% or more and, in order to satisfy also the condition that the etching rate of the same becomes 0.1 nm/sec or less, the (Mo/Mo+Si) ratio should be 13% or more. The upper limit of the (Mo/Mo+Si) ratio is preferably 40% or less. This is because if more molybdenum is contained, there arises a problem that the chemical resistance and the cleaning resistance are degraded.

In the case of oxygen, the degree of reduction in the extinction coefficient relative to its content in the layer is greater as compared with nitrogen and, therefore, in proportion to the oxygen content, the thickness should be more increased for satisfying the required optical density. Since the back-surface reflectance for exposure light can be reduced only with nitrogen, the oxygen content of the lower layer is preferably less than 10 at % and, more preferably, the lower layer is substantially free of oxygen (oxygen is allowed to be contained to a degree due to contamination or the like). On the other hand, when substantially free of oxygen, the nitrogen content in the layer is preferably 35 at % or less also in terms of reducing the back-surface reflectance, but if a further reduction in the thickness of the light-shielding film has priority over the reduction in the back-surface reflectance, it is preferably 30 at % or less and more preferably 20 at % or less.

On the other hand, there is a tendency that silicon containing nitrogen or oxygen has a low conductivity (a high sheet resistance value). Therefore, in a light-shielding film containing a transition metal, silicon, and nitrogen or oxygen, it is necessary to increase the transition metal content in the film in order to increase the conductivity. In the manufacture of a transfer mask from the mask blank, as shown in FIG. 2, a resist film 4 is coated on the light-shielding film 2 (on an etching mask film 3), a design pattern is exposed and transferred to the resist film 4, and then the resist film 4 is developed and cleaned, thereby forming a resist pattern 4a. In recent years, use has been made of a method which applies a resist for electron beam writing exposure to this resist film and irradiates an electron beam for writing (electron beam exposure writing), thereby exposing a design pattern.

In this electron beam writing exposure, in terms of writing position accuracy and charge-up, the thin film under the resist film 4 (in the case of the structure comprising the light-shielding film 2 and the etching mask film 3, at least one of the light-shielding film 2 and the etching mask film 3) is required to be conductive. Specifically, it is desired that the sheet resistance value of at least one of the light-shielding film 2 and the etching mask film 3 be 3 kΩ/square or less. As will be described later, in order to achieve a reduction in the thickness of the resist film 4 (e.g. 100 nm or less), it is necessary to improve the etching rate in dry etching of the etching mask film 3 with respect to a mixed gas of chlorine and oxygen and, for this, the content of a metal component (chromium) should be set to less than 50 at %, preferably 45 at % or less, and more preferably 40 at % or less. In this case, the metal content of the etching mask film is low so that the sheet resistance value becomes greater than 3 kΩ/square. The light-shielding film 2 has the at least two-layer or more laminated structure comprising the upper layer and the lower layer. However, when the upper layer is used as the front-surface antireflection layer, the total content of oxygen and nitrogen is required to be 30 at % or more and, further, in terms of the resistance to mask cleaning, the transition metal content is required to be 10 at % or less, and therefore, it is not easy to ensure the sheet resistance value of 3 kΩ/square or less by the upper layer of the light-shielding film 2.

From these, it is desired that the conductivity be ensured by the lower layer of the light-shielding film 2, i.e. the sheet resistance value of the lower layer be 3 kΩ/square or less. FIG. 3 shows an approximate straight line (approximate curve of "×Sheet Resistance Value 3 kΩ/□" plots) obtained by plotting the (Mo/Mo+Si) ratios and the nitrogen contents of light-shielding films (lower layers) each having a sheet resistance value of 3 kΩ/square or less. This approximate straight line formula is, for example, CN=2.593CMo−24.074. In FIG. 3, a region on the right side of the approximate straight line represents a composition range where a light-shielding film (lower layer) with a sheet resistance value of 3 kΩ/square or less can be formed. In order to simultaneously satisfy the condition that the etching rate of the light-shielding film (lower layer) by the fluorine-containing substance in the state of not being irradiated with the charged particles becomes 0.3 nm/sec or less, the (Mo/Mo+Si) ratio should be 15% or more. Further, in order to satisfy also the condition that the etching rate of the same becomes 0.2 nm/sec or less, the (Mo/Mo+Si) ratio should be 16% or more and, in order to satisfy also the condition that the etching rate of the same becomes 0.1 nm/sec or less, the (Mo/Mo+Si) ratio should be 18% or more.

As the transition metal contained in the material of the lower layer, use can be made of molybdenum, tantalum, tungsten, titanium, chromium, hafnium, nickel, vanadium, zirconium, ruthenium, rhodium, niobium, palladium, or the like. With respect to the ratio obtained by dividing the transition metal content [at %] in the lower layer by the transition metal and silicon total content [at %] in the lower layer (i.e. the ratio, given in at % %, of the transition metal content [at %] in a light-shielding film when the transition metal and silicon total content [at %] in the light-shielding film is given as 100; hereinafter referred to as a (M/M+Si) ratio where M is a transition metal), the description has been given of molybdenum in the above-mentioned example, but approximately the same tendency is shown for the other listed transition metals.

The optical density of a light-shielding film for use in a binary mask blank should be at least 2.3 or more and preferably 2.5 or more. However, in the case of a binary mask blank for producing a binary transfer mask for use in the double exposure technique or the like, if the optical density is only 2.3 or 2.5, there may arise a problem due to leakage light at overlapping exposure portions of a resist on a wafer. Taking this into account, the optical density of the light-shielding film should be at least 2.8 or more and is more preferably 3.0 or more.

On the other hand, in order to solve the problem of shadowing which arises in the DRAM hp32 nm and subsequent generations according to the lithography applied with ArF exposure light of this invention, the thickness of the light-shielding film should be set to less than 65 nm and is preferably set to 60 nm or less. That is, the light-shielding film 2 should ensure the predetermined optical density with the total thickness of the upper and lower layers of less than 65 nm and, more preferably, it ensures the predetermined optical density with 60 nm or less.

Since the material with high reflectance for exposure light is used as the lower layer, the upper layer is required to have a thickness of at least 5 nm or more. Taking into account the above-mentioned shadowing problem, the thickness of the entire light-shielding film 2 is preferably less than 65 nm and, since the optical density required for the light-shielding film should be ensured mainly by the lower layer (light-shielding layer), the upper limit of the upper layer is preferably 20 nm or less. Taking into account the required low reflectivity and the desirable thickness (60 nm or less) of the entire light-shielding film, the thickness of the upper layer is more preferably 7 nm or more and 15 nm or less.

It is preferable that the lower layer (light-shielding layer) further contain at least one element of carbon or hydrogen. In the case of the light-shielding film 2 containing at least one of carbon (C) and hydrogen (H) in addition to a transition metal (molybdenum) and silicon, silicon carbide (Si—C bond) and transition metal carbide (M—C bond, e.g. Mo—C bond) and/or silicon hydride (Si—H bond), which are in a state of being not easily oxidized, are formed in the film during sputtering film formation and, therefore, it is possible to suppress oxidation of silicon and molybdenum due to irradiation of ArF exposure light and thus to expect a longer lifetime of a transfer mask.

Further, since the etching rate in patterning the light-shielding film increases due to the presence of C and/or H (silicon carbide, transition metal carbide, silicon hydride), an increase in the thickness of the resist film is prevented so that there is no degradation of resolution or pattern accuracy. Since the etching time can be shortened, in the case of the structure with the etching mask film on the light-shielding film, it is possible to reduce damage to the etching mask film so that fine patterning is enabled.

The light-shielding film of this invention may have a laminated structure of three or more layers. In this case, for each of the layers of the laminated structure, it is necessary to satisfy the condition that the sufficient etching selectivity of 1:5 or more (more preferably 1:10 or more) is provided between the etching rate by the fluorine-containing substance in the state of not being irradiated with the charged particles and the etching rate by the fluorine-containing substance in the state of being irradiated with the charged particles.

A transfer mask according to this invention is obtained by a transfer mask manufacturing method comprising an etching process of patterning, by etching, the light-shielding film in the mask blank obtained by this invention and a defect correction process of correcting a black defect portion using the EB defect correction technique.

As the etching in this case, dry etching effective for forming a fine pattern is preferably used.

As shown in FIG. 1, the mask blank according to this invention may also be the mask blank 10 having the light-shielding film 2 on the transparent substrate 1 and further having the etching mask film 3 on the light-shielding film 2. In this case, the light-shielding film 2 is the light-shielding film according to the above-mentioned embodiment.

In this invention, in order to ensure etching selectivity to the light-shielding film 2 in dry etching for patterning the light-shielding film 2 to form a transfer pattern, the etching mask film 3 is preferably made of, for example, a material containing chromium and at least one of nitrogen and oxygen as a component. By providing such an etching mask film 3 on the light-shielding film 2, it is possible to achieve a reduction in the thickness of a resist film to be formed on the mask blank. The etching mask film may further contain a component such as carbon. Specifically, for example, there can be cited a material such as CrN, CrON, CrOC, or CrOCN.

The chromium content in the etching mask film is preferably less than 50 at %, more preferably 45 at % or less, and optimally 40 at % or less. The etching rate of the chromium-based material in dry etching using a mixed gas of oxygen and chlorine is improved as oxidation proceeds. Although not so much as in the case of the oxidation, the etching rate in dry etching using the mixed gas of oxygen and chlorine is also improved as nitridation proceeds. When the chromium content is 50 at % or more, the etching rate in dry etching using the mixed gas of oxygen and chlorine is largely reduced. This causes a problem that the thickness of a resist film required for dry-etching this etching mask film becomes large (e.g. greater than 100 nm) so that it is difficult to accurately transfer a fine pattern to the etching mask film.

The thickness of the etching mask film is preferably 5 nm or more and 20 nm or less. If the thickness is less than 5 nm, the film loss of the etching mask film proceeds in a pattern edge direction before completion of dry etching of the light-shielding film using an etching mask film pattern as a mask so that there is a possibility that the CD accuracy of a pattern transferred to the light-shielding film with respect to a design pattern is largely degraded. On the other hand, if the thickness is greater than 20 nm, the resist film thickness required for transferring a design pattern to the etching mask film becomes large so that it is difficult to accurately transfer a fine pattern to the etching mask film.

On the other hand, as shown in FIG. 3, with respect to either of the upper and lower layers of the light-shielding film 2, even in the range where the etching rate by the fluorine-containing substance in the state of not being irradiated with the charged particles has no problem, there is a case where the sheet resistance value of 3 k$\Omega$/square or less cannot be ensured. In this case, it should be considered to ensure the sheet resistance value of 3 k$\Omega$/square or less by the etching mask film 3. In terms of ensuring the sheet resistance value of 3 k$\Omega$/square or less by the etching mask film 3, the content of chromium in the film should be 60 at % or more and is preferably 70 at % or more and optimally 80 at % or more.

However, as the chromium content of the etching mask film 3 increases, the etching rate in dry etching using a mixed gas of chlorine and oxygen decreases. If the thickness of the etching mask film 3 is, for example, 20 nm which is the maximum value in the above-mentioned thickness range, there arises a necessity to set the resist film thickness to greater than 100 nm. In the case where the chromium content in the film is set high as described above, the thickness of the etching mask film 3 should be set thinner, but it is necessary to satisfy also the condition that the etching mask film 3 functions as an etching mask when dry-etching the light-shielding film 2 to form a transfer pattern. Taking into account these conditions, the upper limit of the thickness of the etching mask film 3 with the high chromium content is preferably set to 10 nm or less and more preferably 7 nm or less. On the other hand, although the etching mask film 3 with the high chromium content has high resistance to an etching gas for use in dry-etching the light-shielding film 2, the lower limit of the film thickness is at least 4 nm and preferably 5 nm or more.

EXAMPLES

Hereinbelow, the embodiment of this invention will be described in further detail with reference to Examples. In addition, a Comparative Example with respect to the Examples will also be described.

Example 1

In a single-wafer sputtering apparatus, using a mixed target of molybdenum (Mo) and silicon (Si) (at % ratio Mo:Si=21:79) as a sputtering target, reactive sputtering (DC sputtering) was carried out by setting the power of a DC power supply to 2.1 kW in a mixed gas atmosphere of argon and nitrogen (gas pressure 0.07 Pa, gas flow rate ratio Ar:$N_2$=25:28), thereby forming a MoSiN film (lower layer (light-shielding layer)) to a thickness of 50 nm on a transparent substrate 1 made of synthetic quartz glass. Then, using a Mo/Si target (at % ratio Mo:Si=4:96), reactive sputtering (DC sputtering) was carried out by setting the power of a DC power supply to 3.0 kW in a mixed gas of argon, oxygen, nitrogen, and helium (gas pressure 0.1 Pa, gas flow rate ratio Ar:$O_2$:$N_2$:He=6:3:11:17), thereby forming a MoSiON film (upper layer (front-surface antireflection layer)) to a thickness of 10 nm. In this manner, there was formed a light-shielding film 2 (total thickness 60 nm) for ArF excimer laser (wavelength 193 nm) in the form of a laminate comprising the MoSiN film (film composition ratio Mo: 14.7 at %, Si: 56.2 at %, N, 29.1 at %) and the MoSiON film (film composition ratio Mo: 2.6 at %, Si: 57.1 at %, O: 15.9 at %, N, 24.4 at %). The elements of the respective layers of the light-shielding film 2 were analyzed by the Rutherford backscattering spectrometry (hereinafter the same shall apply to the Examples and the Comparative Example). The optical density (OD) of the light-shielding film 2 was 3.0 at the wavelength of ArF excimer laser exposure light.

Then, the substrate 1 with the light-shielding film 2 was heat-treated (annealed) at 450° C. for 30 minutes, thereby reducing the film stress of the light-shielding film 2.

Then, an etching mask film 3 was formed on an upper surface of the light-shielding film 2. Specifically, in a single-wafer sputtering apparatus, using a chromium (Cr) target, reactive sputtering (DC sputtering) was carried out by setting the power of a DC power supply to 1.8 kW in a mixed gas atmosphere of argon, carbon dioxide, nitrogen, and helium (gas pressure 0.2 Pa, gas flow rate ratio Ar:$CO_2$:$N_2$:He=21:37:11:31), thereby forming a CrOCN film to a thickness of 10 nm. Further, the etching mask film 3 (CrOCN film) was annealed at a temperature lower than that of the annealing of the light-shielding film 2, thereby adjusting the film stress of the etching mask film 3 to be as small as possible (preferably, substantially zero) without affecting the film stress of the light-shielding film 2. In the manner described above, a binary mask blank 10 was obtained.

Then, a binary transfer mask was manufactured using the mask blank 10 manufactured as described above. FIG. 2 shows manufacturing processes thereof.

First, a chemically amplified positive resist film 4 for electron beam writing (PRL009 manufactured by FUJIFILM Electronic Materials Co., Ltd.) was formed on the mask blank 10 (see FIG. 2, (a)).

Then, using an electron beam writing apparatus, a desired pattern was written on the resist film 4 (see the same figure, (b)) and, thereafter, the resist film 4 was developed with a predetermined developer, thereby forming a resist pattern 4a (see the same figure, (c)). In this event, in order to carry out verification of EB defect correction, a program defect portion (a portion to be a black defect) was included in advance in the pattern writing.

Then, using the resist pattern 4a as a mask, the etching mask film 3 in the form of the CrOCN film was dry-etched, thereby forming an etching mask film pattern 3a (see the same figure, (d)). A mixed gas of oxygen and chlorine ($O_2$:$Cl_2$=1:4) was used as a dry etching gas.

Then, the remaining resist pattern 4a was removed by ashing or the like. Then, using the etching mask film pattern 3a as a mask, the light-shielding film 2 in the form of the laminate of the MoSiN film and the MoSiON film was dry-etched, thereby forming a light-shielding film pattern 2a (see the same figure, (e)). A mixed gas of $SF_6$ and He was used as a dry etching gas. Finally, the etching mask film pattern 3a was removed using a mixed gas of oxygen and chlorine ($O_2$:$Cl_2$=1:4) (see the same figure, (f)).

In the manner described above, a binary transfer mask 20 was obtained (see the same figure, (f)).

Then, a $XeF_2$ gas as a fluorine-containing substance was supplied to a program defect portion (a black defect portion where the light-shielding film remained) of the binary transfer mask 20 and, further, an electron beam (5.0 keV) was irradiated thereto, thereby carrying out EB defect correction for removing the black defect portion by etching. Water (vapor) was supplied while etching the lower layer to properly reduce the etching rate of the lower layer.

In this event, in the upper layer of the light-shielding film, the etching rate of other than the black defect portion by the $XeF_2$ gas (the etching rate by the fluorine-containing substance in the state of not being irradiated with the charged particles) was less than 0.1 nm/sec. Also in the lower layer, the etching rate of other than the black defect portion by the $XeF_2$ gas was less than 0.1 nm/sec. Therefore, both the upper and lower layers of the light-shielding film satisfied the condition of the etching selectivity of 1:5 or more between the etching rate of other than the black defect portion by the $XeF_2$ gas and the etching rate of the black defect portion by the $XeF_2$ gas (the etching rate by the fluorine-containing substance in the state of being irradiated with the charged particles). Further, the black defect was satisfactorily corrected without the occurrence of a disadvantage such as an undercut of the lower layer.

The optical properties of the obtained binary transfer mask 20 were measured by a spectrophotometer SolidSpec-3700DUV (manufactured by Shimadzu Corporation). As a result, the optical density of the light-shielding film 2 for ArF exposure light was 3.0 and thus the light-shielding performance was sufficient for a binary transfer mask. Further, the front-surface reflectance and the back-surface reflectance of the light-shielding film 2 for ArF exposure light were 15.7% and 32.7%, respectively, which are the reflectances that do not affect pattern transfer.

While the sheet resistance value of the etching mask film 3 was higher than 3.0 kΩ, the sheet resistance value of the light-shielding film 2 was lower than 3.0 kΩ and thus the conductivity is excellent, and therefore, the writing position accuracy in the electron beam writing in the manufacture of the transfer mask was high and thus the manufactured transfer mask satisfied the position accuracy required for the DRAM hp32 nm generation.

A binary mask blank formed with no etching mask film 3 was manufactured in the same manner as described above. Then, the $XeF_2$ gas as the fluorine-containing substance was supplied with no electron beam irradiation to etch an upper layer from its surface, thereby measuring an etching rate of the upper layer by the fluorine-containing substance in the state of not being irradiated with the charged particles. As a result, it was less than 0.1 nm/sec. Further, the upper layer in a predetermined region was removed by etching and then the $XeF_2$ gas as the fluorine-containing substance was supplied to a surface of a lower layer with no electron beam irradiation to etch the lower layer from its surface, thereby measuring an etching rate of the lower layer by the fluorine-containing substance in the state of not being irradiated with the charged particles. As a result, it was less than 0.1 nm/sec. Therefore, both the upper and lower layers of a light-shielding film satisfied the condition of the etching selectivity of 1:5 or more between the etching rate by the $XeF_2$ gas in the state of not being irradiated with the charged particles and the etching rate by the $XeF_2$ gas in the state of being irradiated with the charged particles.

Example 2

In a single-wafer sputtering apparatus, using a mixed target of molybdenum (Mo) and silicon (Si) (at % ratio Mo:Si=21:79) as a sputtering target, reactive sputtering (DC sputtering) was carried out by setting the power of a DC power supply to 2.1 kW in a mixed gas atmosphere of argon, methane, and nitrogen (gas pressure 0.07 Pa, gas flow rate ratio Ar+$CH_4$ (8%):$N_2$=25:28), thereby forming a MoSiNCH film (lower layer (light-shielding layer)) to a thickness of 50 nm on a transparent substrate 1 made of synthetic quartz glass. Then, using a Mo/Si target (at % ratio Mo:Si=4:96), reactive sputtering (DC sputtering) was carried out by setting the power of a DC power supply to 3.0 kW in a mixed gas atmosphere of argon, oxygen, nitrogen, and helium (gas pressure 0.1 Pa, gas flow rate ratio Ar:$O_2$:$N_2$:He=6:3:11:17), thereby forming a MoSiON film (upper layer (front-surface antireflection layer)) to a thickness of 10 nm. In this manner, there was formed a light-shielding film 2 (total thickness 60 nm) for ArF excimer laser (wavelength 193 nm) in the form of a laminate comprising the MoSiNCH film (film composition ratio Mo: 14.5 at %, Si: 55.3 at %, N, 27.8 at %, C, 0.6 at %, H, 1.8 at %) and the MoSiON film (film composition ratio Mo: 2.6 at %, Si: 57.1 at %, O: 15.9 at %, N, 24.4 at %). The optical density (OD) of the light-shielding film 2 was 3.0 at the wavelength of ArF excimer laser exposure light.

Then, in the same manner as in Example 1, the light-shielding film 2 was annealed and then an etching mask film 3 was formed on an upper surface of the light-shielding film 2, thereby obtaining a binary mask blank 10. Further, in the same manner as in Example 1, a binary transfer mask 20 was manufactured using this mask blank 10.

Then, in the same manner as in Example 1, a $XeF_2$ gas as a fluorine-containing substance was supplied to a program defect portion (a black defect portion where the light-shielding film remained) of the binary transfer mask 20 and, further, an electron beam (5.0 keV) was irradiated thereto, thereby carrying out EB defect correction for removing the black defect portion by etching. Water (vapor) was supplied while etching the lower layer to properly reduce the etching rate of the lower layer.

In this event, in the upper layer of the light-shielding film, the etching rate of other than the black defect portion by the $XeF_2$ gas (the etching rate by the fluorine-containing substance in the state of not being irradiated with the charged particles) was less than 0.1 nm/sec. Also in the lower layer, the etching rate of other than the black defect portion by the $XeF_2$ gas was less than 0.1 nm/sec. Therefore, both the upper and lower layers of the light-shielding film satisfied the condition of the etching selectivity of 1:5 or more between the etching rate of other than the black defect portion by the $XeF_2$ gas and the etching rate of the black defect portion by the $XeF_2$ gas (the etching rate by the fluorine-containing substance in the state of being irradiated with the charged particles). Further, the black defect was satisfactorily corrected without the occurrence of a disadvantage such as an undercut of the lower layer.

The optical properties of the obtained binary transfer mask 20 were measured by a spectrophotometer SolidSpec-3700DUV (manufactured by Shimadzu Corporation). As a result, the optical density of the light-shielding film 2 for ArF exposure light was 3.0 and thus the light-shielding performance was sufficient for a binary transfer mask. Further, the front-surface reflectance and the back-surface reflectance of the light-shielding film 2 for ArF exposure light were 15.5% and 32.4%, respectively, which are the reflectances that do not affect pattern transfer.

While the sheet resistance value of the etching mask film 3 was higher than 3.0 kΩ, the sheet resistance value of the light-shielding film 2 was lower than 3.0 kΩ and thus the conductivity was excellent, and therefore, the writing position accuracy in the electron beam writing in the manufacture of the transfer mask was high and thus the manufactured transfer mask satisfied the position accuracy required for the DRAM hp32 nm generation.

A binary mask blank formed with no etching mask film 3 was manufactured in the same manner as described above. Then, the XeF$_2$ gas as the fluorine-containing substance was supplied with no electron beam irradiation to etch an upper layer from its surface, thereby measuring an etching rate of the upper layer by the fluorine-containing substance in the state of not being irradiated with the charged particles. As a result, it was less than 0.1 nm/sec. Further, the upper layer in a predetermined region was removed by etching and then the XeF$_2$ gas as the fluorine-containing substance was supplied to a surface of a lower layer with no electron beam irradiation to etch the lower layer from its surface, thereby measuring an etching rate of the lower layer by the fluorine-containing substance in the state of not being irradiated with the charged particles. As a result, it was less than 0.1 nm/sec. Therefore, both the upper and lower layers of a light-shielding film satisfied the condition of the etching selectivity of 1:5 or more between the etching rate by the XeF$_2$ gas in the state of not being irradiated with the charged particles and the etching rate by the XeF$_2$ gas in the state of being irradiated with the charged particles.

Example 3

In a single-wafer sputtering apparatus, using a mixed target of molybdenum (Mo) and silicon (Si) (at % ratio Mo:Si=21: 79) as a sputtering target, reactive sputtering (DC sputtering) was carried out by setting the power of a DC power supply to 2.1 kW in a mixed gas atmosphere of argon and nitrogen (gas pressure 0.07 Pa, gas flow rate ratio Ar:N$_2$=25:15), thereby forming a MoSiN film (lower layer (light-shielding layer)) to a thickness of 49 nm on a transparent substrate 1 made of synthetic quartz glass. Then, using a Mo/Si target (at % ratio Mo:Si=4:96), reactive sputtering (DC sputtering) was carried out by setting the power of a DC power supply to 3.0 kW in a mixed gas atmosphere of argon, oxygen, nitrogen, and helium (gas pressure 0.1 Pa, gas flow rate ratio Ar:O$_2$:N$_2$:He=6:3:11: 17), thereby forming a MoSiON film (upper layer (front-surface antireflection layer)) to a thickness of 10 nm. In this manner, there was formed a light-shielding film 2 (total thickness 59 nm) for ArF excimer laser (wavelength 193 nm) in the form of a laminate comprising the MoSiN film (film composition ratio Mo: 15.7 at %, Si: 64.8 at %, N, 19.5 at %) and the MoSiON film (film composition ratio Mo: 2.6 at %, Si: 57.1 at %, O: 15.9 at %, N, 24.4 at %). The optical density (OD) of the light-shielding film 2 was 3.0 at the wavelength of ArF excimer laser exposure light.

Then, in the same manner as in Example 1, the light-shielding film 2 was annealed and then an etching mask film 3 was formed on an upper surface of the light-shielding film 2, thereby obtaining a binary mask blank 10. Further, in the same manner as in Example 1, a binary transfer mask 20 was manufactured using this mask blank 10.

Then, in the same manner as in Example 1, a XeF$_2$ gas as a fluorine-containing substance was supplied to a program defect portion (a black defect portion where the light-shielding film remained) of the binary transfer mask 20 and, further, an electron beam (5.0 keV) was irradiated thereto, thereby carrying out EB defect correction for removing the black defect portion by etching. Water (vapor) was supplied while etching the lower layer to properly reduce the etching rate of the lower layer.

In this event, in the upper layer of the light-shielding film, the etching rate of other than the black defect portion by the XeF$_2$ gas (the etching rate by the fluorine-containing substance in the state of not being irradiated with the charged particles) was less than 0.1 nm/sec. In the lower layer, the etching rate of other than the black defect portion by the XeF$_2$ gas was 0.17 nm/sec and thus was less than 0.2 nm/sec. Therefore, both the upper and lower layers of the light-shielding film satisfied the condition of the etching selectivity of 1:5 or more between the etching rate of other than the black defect portion by the XeF$_2$ gas and the etching rate of the black defect portion by the XeF$_2$ gas (the etching rate by the fluorine-containing substance in the state of being irradiated with the charged particles). Further, the black defect was satisfactorily corrected without the occurrence of a disadvantage such as an undercut of the lower layer.

The optical properties of the obtained binary transfer mask 20 were measured by SolidSpec-3700DUV (manufactured by Shimadzu Corporation). As a result, the optical density of the light-shielding film 2 for ArF exposure light was 3.0 and thus the light-shielding performance was sufficient for a binary transfer mask. Further, the front-surface reflectance and the back-surface reflectance of the light-shielding film 2 for ArF exposure light were 15.2% and 31.7%, respectively, which are the reflectances that do not affect pattern transfer.

While the sheet resistance value of the etching mask film 3 was higher than 3.0 kΩ, the sheet resistance value of the light-shielding film 2 was lower than 3.0 kΩ and thus the conductivity was excellent, and therefore, the writing position accuracy in the electron beam writing in the manufacture of the transfer mask was high and thus the manufactured transfer mask satisfied the position accuracy required for the DRAM hp32 nm generation.

A binary mask blank formed with no etching mask film 3 was manufactured in the same manner as described above. Then, the XeF$_2$ gas as the fluorine-containing substance was supplied with no electron beam irradiation to etch an upper layer from its surface, thereby measuring an etching rate of the upper layer by the fluorine-containing substance in the state of not being irradiated with the charged particles. As a result, it was less than 0.1 nm/sec. Further, the upper layer in a predetermined region was removed by etching and then the XeF$_2$ gas as the fluorine-containing substance was supplied to a surface of a lower layer with no electron beam irradiation to etch the lower layer from its surface, thereby measuring an etching rate of the lower layer by the fluorine-containing substance in the state of not being irradiated with the charged particles. As a result, it was 0.17 nm/sec and thus was less than 0.2 nm/sec. Therefore, both the upper and lower layers of a light-shielding film satisfied the condition of the etching selectivity of 1:5 or more between the etching rate by the XeF$_2$ gas in the state of not being irradiated with the charged particles and the etching rate by the XeF$_2$ gas in the state of being irradiated with the charged particles.

Example 4

In a single-wafer sputtering apparatus, using a mixed target of molybdenum (Mo) and silicon (Si) (at % ratio Mo:Si=33: 67) as a sputtering target, reactive sputtering (DC sputtering) was carried out by setting the power of a DC power supply to 2.0 kW in a mixed gas atmosphere of argon and nitrogen (gas pressure 0.1 Pa, gas flow rate ratio Ar:N$_2$=25:30), thereby forming a MoSiN film (lower layer (light-shielding layer)) to a thickness of 48 nm on a transparent substrate 1 made of quartz glass. Then, using a Mo/Si target (at % ratio Mo:Si=4: 96), reactive sputtering (DC sputtering) was carried out by setting the power of a DC power supply to 3.0 kW in a mixed gas atmosphere of argon, oxygen, nitrogen, and helium (gas pressure 0.1 Pa, gas flow rate ratio Ar:O$_2$:N$_2$:He=6:3:11:17), thereby forming a MoSiON film (upper layer (front-surface antireflection layer)) to a thickness of 10 nm. In this manner, there was formed a light-shielding film 2 (total thickness 58 nm) for ArF excimer laser (wavelength 193 nm) in the form of a laminate comprising the MoSiN film (film composition ratio Mo: 22.3 at %, Si: 46.1 at %, N, 31.6 at %) and the MoSiON film (film composition ratio Mo: 2.6 at %, Si: 57.1 at %, O: 15.9 at %, N, 24.4 at %). The optical density (OD) of the light-shielding film 2 was 3.0 at the wavelength of ArF excimer laser exposure light.

Then, in the same manner as in Example 1, the light-shielding film 2 was annealed and then an etching mask film 3 was formed on an upper surface of the light-shielding film 2 while the thickness of the etching mask film 3 was changed to 15 nm, thereby obtaining a binary mask blank 10. Further, in the same manner as in Example 1, a binary transfer mask 20 was manufactured using this mask blank 10.

Then, in the same manner as in Example 1, a $XeF_2$ gas as a fluorine-containing substance was supplied to a program defect portion (a black defect portion where the light-shielding film remained) of the binary transfer mask 20 and, further, an electron beam (5.0 keV) was irradiated thereto, thereby carrying out EB defect correction for removing the black defect portion by etching. Water (vapor) was supplied while etching the lower layer to properly reduce the etching rate of the lower layer.

In this event, in the upper layer of the light-shielding film, the etching rate of other than the black defect portion by the $XeF_2$ gas (the etching rate by the fluorine-containing substance in the state of not being irradiated with the charged particles) was less than 0.1 nm/sec. Also in the lower layer, the etching rate of other than the black defect portion by the $XeF_2$ gas was less than 0.1 nm/sec. Therefore, both the upper and lower layers of the light-shielding film satisfied the condition of the etching selectivity of 1:5 or more between the etching rate of other than the black defect portion by the $XeF_2$ gas and the etching rate of the black defect portion by the $XeF_2$ gas (the etching rate by the fluorine-containing substance in the state of being irradiated with the charged particles). Further, the black defect was satisfactorily corrected without the occurrence of a disadvantage such as an undercut of the lower layer.

As a result of the EB defect correction, the black defect was satisfactorily corrected without the occurrence of a disadvantage such as etching of a portion which should not primarily be corrected or an undercut of the lower layer.

Then, the optical properties of the obtained binary transfer mask 20 were measured by SolidSpec-3700DUV (manufactured by Shimadzu Corporation). As a result, the optical density of the light-shielding film 2 for ArF exposure light was 3.0 and thus the light-shielding performance was sufficient for a binary transfer mask. Further, the front-surface reflectance and the back-surface reflectance of the light-shielding film 2 for ArF exposure light were 16.3% and 34.5%, respectively, which are the reflectances that do not affect pattern transfer.

While the sheet resistance value of the etching mask film 3 was higher than 3.0 kΩ, the sheet resistance value of the light-shielding film 2 was lower than 3.0 kΩ and thus the conductivity was excellent, and therefore, the writing position accuracy in the electron beam writing in the manufacture of the transfer mask was high and thus the manufactured transfer mask satisfied the position accuracy required for the DRAM hp32 nm generation.

A binary mask blank formed with no etching mask film 3 was manufactured in the same manner as described above. Then, the $XeF_2$ gas as the fluorine-containing substance was supplied to an arbitrary portion of a surface of a light-shielding film 2 with no electron beam irradiation to etch an upper layer from its surface, thereby measuring an etching rate of the upper layer by the fluorine-containing substance in the state of not being irradiated with the charged particles. As a result, it was less than 0.1 nm/sec. Further, the upper layer in a predetermined region was removed by etching and then the $XeF_2$ gas as the fluorine-containing substance was supplied to a surface of a lower layer with no electron beam irradiation to etch the lower layer from its surface, thereby measuring an etching rate of the lower layer by the fluorine-containing substance in the state of not being irradiated with the charged particles. As a result, it was less than 0.1 nm/sec. Therefore, both the upper and lower layers of the light-shielding film satisfied the condition of the etching selectivity of 1:5 or more between the etching rate by the $XeF_2$ gas in the state of not being irradiated with the charged particles and the etching rate by the $XeF_2$ gas in the state of being irradiated with the charged particles.

Example 5

In a single-wafer sputtering apparatus, using a mixed target of molybdenum (Mo) and silicon (Si) (at % ratio Mo:Si=33:67) as a sputtering target, reactive sputtering (DC sputtering) was carried out by setting the power of a DC power supply to 2.0 kW in a mixed gas atmosphere of argon, methane, and nitrogen (gas pressure 0.1 Pa, gas flow rate ratio Ar+$CH_4$ (8%):N2=25:30), thereby forming a MoSiNCH film (lower layer (light-shielding layer)) to a thickness of 48 nm on a transparent substrate 1 made of quartz glass. Then, using a Mo/Si target (at % ratio Mo:Si=4:96), reactive sputtering (DC sputtering) was carried out by setting the power of a DC power supply to 3.0 kW in a mixed gas atmosphere of argon, oxygen, nitrogen, and helium (gas pressure 0.1 Pa, gas flow rate ratio Ar:O2:N2:He=6:3:11:17), thereby forming a MoSiON film (upper layer (front-surface antireflection layer)) to a thickness of 10 nm. In this manner, there was formed a light-shielding film 2 (total thickness 58 nm) for ArF excimer laser (wavelength 193 nm) in the form of a laminate comprising the MoSiNCH film (film composition ratio Mo: 21.0 at %, Si: 43.5 at %, N, 31.6 at %, C, 0.4 at %, H, 3.5 at %) and the MoSiON film (film composition ratio Mo: 2.6 at %, Si: 57.1 at %, O: 15.9 at %, N, 24.4 at %). The optical density (OD) of the light-shielding film 2 was 3.0 at the wavelength of ArF excimer laser exposure light.

Then, in the same manner as in Example 4, the light-shielding film 2 was annealed and then an etching mask film 3 was formed on an upper surface of the light-shielding film 2, thereby obtaining a binary mask blank 10. Further, in the same manner as in Example 1, a binary transfer mask 20 was manufactured using this mask blank 10.

Then, in the same manner as in Example 1, a $XeF_2$ gas as a fluorine-containing substance was supplied to a program defect portion (a black defect portion where the light-shielding film remained) of the binary transfer mask 20 and, further, an electron beam (5.0 keV) was irradiated thereto, thereby carrying out EB defect correction for removing the black defect portion by etching. Water (vapor) was supplied while etching the lower layer to properly reduce the etching rate of the lower layer.

In this event, in the upper layer of the light-shielding film, the etching rate of other than the black defect portion by the $XeF_2$ gas (the etching rate by the fluorine-containing substance in the state of not being irradiated with the charged particles) was less than 0.1 nm/sec. Also in the lower layer, the etching rate of other than the black defect portion by the $XeF_2$ gas was less than 0.1 nm/sec. Therefore, both the upper and lower layers of the light-shielding film satisfied the condition of the etching selectivity of 1:5 or more between the etching rate of other than the black defect portion by the $XeF_2$ gas and the etching rate of the black defect portion by the $XeF_2$ gas (the etching rate by the fluorine-containing substance in the state of being irradiated with the charged particles). Further, the black defect was satisfactorily corrected without the occurrence of a disadvantage such as an undercut of the lower layer.

The optical properties of the obtained binary transfer mask 20 were measured by a spectrophotometer SolidSpec-3700DUV (manufactured by Shimadzu Corporation). As a result, the optical density of the light-shielding film 2 for ArF exposure light was 3.0 and thus the light-shielding performance was sufficient for a binary transfer mask. Further, the front-surface reflectance and the back-surface reflectance of the light-shielding film 2 for ArF exposure light were 16.1% and 30.4%, respectively, which are the reflectances that do not affect pattern transfer.

While the sheet resistance value of the etching mask film 3 was higher than 3.0 kΩ, the sheet resistance value of the light-shielding film 2 was lower than 3.0 kΩ and thus the conductivity was excellent, and therefore, the writing position accuracy in the electron beam writing in the manufacture of the transfer mask was high and thus the manufactured transfer mask satisfied the position accuracy required for the DRAM hp32 nm generation.

A binary mask blank formed with no etching mask film 3 was manufactured in the same manner as described above. Then, the $XeF_2$ gas as the fluorine-containing substance was supplied with no electron beam irradiation to etch an upper layer from its surface, thereby measuring an etching rate of the upper layer by the fluorine-containing substance in the state of not being irradiated with the charged particles. As a result, it was less than 0.1 nm/sec. Further, the upper layer in a predetermined region was removed by etching and then the $XeF_2$ gas as the fluorine-containing substance was supplied to a surface of a lower layer with no electron beam irradiation to etch the lower layer from its surface, thereby measuring an etching rate of the lower layer by the fluorine-containing substance in the state of not being irradiated with the charged particles. As a result, it was less than 0.1 nm/sec. Therefore, both the upper and lower layers of a light-shielding film satisfied the condition of the etching selectivity of 1:5 or more between the etching rate by the $XeF_2$ gas in the state of not being irradiated with the charged particles and the etching rate by the $XeF_2$ gas in the state of being irradiated with the charged particles.

Example 6

In a single-wafer sputtering apparatus, using a mixed target of molybdenum (Mo) and silicon (Si) (at % ratio Mo:Si=13:87) as a sputtering target, reactive sputtering (DC sputtering) was carried out in a mixed gas atmosphere of argon and nitrogen, thereby forming a MoSiN film (lower layer (light-shielding layer)) to a thickness of 47 nm on a transparent substrate 1 made of synthetic quartz glass. Then, using a Mo/Si target (at % ratio Mo:Si=13:87), reactive sputtering (DC sputtering) was carried out in a mixed gas atmosphere of argon and nitrogen, thereby forming a MoSiN film (upper layer (front-surface antireflection layer)) to a thickness of 13 nm. In this manner, there was formed a light-shielding film 2 (total thickness 60 nm) for ArF excimer laser (wavelength 193 nm) in the form of a laminate comprising the MoSiN film (film composition ratio Mo: 9.7 at %, Si: 66.2 at %, N, 24.1 at %) and the MoSiN film (film composition ratio Mo: 7.4 at %, Si: 50.8 at %, N, 41.8 at %). The optical density (OD) of the light-shielding film 2 was 3.0 at the wavelength of ArF excimer laser exposure light.

Then, the substrate 1 with the light-shielding film 2 was heat-treated (annealed) at 450° C. for 30 minutes, thereby reducing the film stress of the light-shielding film 2.

Then, an etching mask film 3 was formed on an upper surface of the light-shielding film 2. Specifically, in a single-wafer sputtering apparatus, using a chromium (Cr) target, reactive sputtering (DC sputtering) was carried out in a mixed gas atmosphere of argon and nitrogen, thereby forming a CrN film (film composition ratio Cr: 90 at %, N: 10 at %) to a thickness of 5 nm. Further, the etching mask film 3 was annealed at a temperature (about 200° C.) lower than that of the annealing of the light-shielding film 2, thereby adjusting the film stress of the etching mask film 3 to be as small as possible (preferably, substantially zero) without affecting the film stress of the light-shielding film 2. In the manner described above, a binary mask blank 10 was obtained. Further, in the same manner as in Example 1, a binary transfer mask 20 was manufactured using this mask blank 10.

Then, in the same manner as in Example 1, a $XeF_2$ gas as a fluorine-containing substance was supplied to a program defect portion (a black defect portion where the light-shielding film remained) of the binary transfer mask 20 and, further, an electron beam (5.0 keV) was irradiated thereto, thereby carrying out EB defect correction for removing the black defect portion by etching. Water (vapor) was supplied while etching the lower layer to properly reduce the etching rate of the lower layer.

In this event, in the upper layer of the light-shielding film, the etching rate of other than the black defect portion by the $XeF_2$ gas (the etching rate by the fluorine-containing substance in the state of not being irradiated with the charged particles) was less than 0.1 nm/sec. Also in the lower layer, the etching rate of other than the black defect portion by the $XeF_2$ gas was less than 0.1 nm/sec. Therefore, both the upper and lower layers of the light-shielding film satisfied the condition of the etching selectivity of 1:5 or more between the etching rate of other than the black defect portion by the $XeF_2$ gas and the etching rate of the black defect portion by the $XeF_2$ gas (the etching rate by the fluorine-containing substance in the state of being irradiated with the charged particles). Further, the black defect was satisfactorily corrected without the occurrence of a disadvantage such as an undercut of the lower layer.

Then, the optical properties of the obtained binary transfer mask 20 were measured by a spectrophotometer SolidSpec-3700DUV (manufactured by Shimadzu Corporation). As a result, the optical density of the light-shielding film 2 for ArF exposure light was 3.0 and thus the light-shielding performance was sufficient for a binary transfer mask. Further, the front-surface reflectance and the back-surface reflectance of the light-shielding film 2 for ArF exposure light were 18.6% and 30.0%, respectively, which are the reflectances that do not affect pattern transfer.

While the sheet resistance value of the light-shielding film 2 was higher than 3.0 kΩ, the sheet resistance value of the etching mask film 3 was lower than 3.0 kΩ and thus the conductivity was excellent, and therefore, the writing position accuracy in the electron beam writing in the manufacture of the transfer mask was high and thus the manufactured transfer mask satisfied the position accuracy required for the DRAM hp32 nm generation. Further, by setting the thickness of the etching mask film to 5 nm, even if the thickness of a resist film was 100 nm or less, a resist pattern was accurately transferred to the etching mask film 3.

A binary mask blank formed with no etching mask film 3 was manufactured in the same manner as described above. Then, the XeF$_2$ gas as the fluorine-containing substance was supplied with no electron beam irradiation to etch an upper layer from its surface, thereby measuring an etching rate of the upper layer by the fluorine-containing substance in the state of not being irradiated with the charged particles. As a result, it was less than 0.1 nm/sec. Further, the upper layer in a predetermined region was removed by etching and then the XeF$_2$ gas as the fluorine-containing substance was supplied to a surface of a lower layer with no electron beam irradiation to etch the lower layer from its surface, thereby measuring an etching rate of the lower layer by the fluorine-containing substance in the state of not being irradiated with the charged particles. As a result, it was less than 0.1 nm/sec. Therefore, both the upper and lower layers of a light-shielding film satisfied the condition of the etching selectivity of 1:5 or more between the etching rate by the XeF$_2$ gas in the state of not being irradiated with the charged particles and the etching rate by the XeF$_2$ gas in the state of being irradiated with the charged particles.

Comparative Example

In a single-wafer sputtering apparatus, using a mixed target of molybdenum (Mo) and silicon (Si) (at % ratio Mo:Si=11:89) as a sputtering target, reactive sputtering (DC sputtering) was carried out in a mixed gas atmosphere of argon and nitrogen, thereby forming a MoSiN film (lower layer (light-shielding layer)) to a thickness of 40 nm on a transparent substrate 1 made of quartz glass. Then, using a Mo/Si target (at % ratio Mo:Si=4:96), reactive sputtering (DC sputtering) was carried out in a mixed gas atmosphere of argon, oxygen, and nitrogen, thereby forming a MoSiON film (upper layer (front-surface antireflection layer)) to a thickness of 10 nm. In this manner, there was formed a light-shielding film (total thickness 50 nm) for ArF excimer laser (wavelength 193 nm) in the form of a laminate comprising the MoSiN film (film composition ratio Mo: 9.9 at %, Si: 82.3 at %, N, 7.8 at %) and the MoSiON film (film composition ratio Mo: 2.6 at %, Si: 57.1 at %, O: 15.9 at %, N, 24.4 at %). The optical density (OD) of the light-shielding film 2 was 3.0 at the wavelength of ArF excimer laser exposure light.

Then, in the same manner as in Example 1, the light-shielding film 2 was annealed and then an etching mask film 3 was formed on an upper surface of the light-shielding film 2, thereby obtaining a binary mask blank. Further, in the same manner as in Example 1, a binary transfer mask was manufactured using this mask blank.

Then, in the same manner as in Example 1, a XeF$_2$ gas as a fluorine-containing substance was supplied to a program defect portion (a black defect portion where the light-shielding film remained) of this binary transfer mask and, further, an electron beam (5.0 keV) was irradiated thereto, thereby carrying out EB defect correction for removing the black defect portion by etching. Water (vapor) was supplied while etching the lower layer to properly reduce the etching rate of the lower layer.

In this event, in the upper layer of the light-shielding film, the etching rate of other than the black defect portion by the XeF2 gas (the etching rate by the fluorine-containing substance in the state of not being irradiated with the charged particles) was less than 0.1 nm/sec. However, in the lower layer, the etching rate of other than the black defect portion by the XeF2 gas was greater than 0.3 nm/sec. Therefore, the lower layer of the light-shielding film did not satisfy the condition of the etching selectivity of 1:5 or more between the etching rate of other than the black defect portion by the XeF2 gas and the etching rate of the black defect portion by the XeF2 gas (the etching rate by the fluorine-containing substance in the state of being irradiated with the charged particles). As a consequence, particularly in the lower layer, its pattern side wall other than the black defect portion was largely etched (corroded) by the XeF2 gas so that the transfer mask was not able to be used as a transfer mask.

Further, the sheet resistance value of the light-shielding film 2 was higher than 3.0 kΩ and further the sheet resistance value of the etching mask film 3 was also higher than 3.0 kΩ, and therefore, the conductivity was low. Thus, the writing position accuracy in the electron beam writing in the manufacture of the transfer mask was low and therefore the manufactured transfer mask did not satisfy the position accuracy required for the DRAM hp32 nm generation.

DESCRIPTION OF SYMBOLS

1 transparent substrate
2 light-shielding film
3 etching mask film
4 resist film
10 mask blank
20 transfer mask

The invention claimed is:

1. A mask blank adapted to manufacture a transfer mask, comprising:
   a transparent substrate; and
   a thin film formed on the transparent substrate, the thin film serving to form a transfer pattern;
   wherein thin film is composed of a material containing a transition metal, silicon, and at least one or more elements selected from oxygen and nitrogen, and
   wherein an etching rate of the thin film by a fluorine-containing substance in a state of not being irradiated with charged particles is 0.3 nm/sec or less.

2. The mask blank according to claim 1, wherein a ratio obtained by dividing a content of the transition metal in the thin film by a total content of the transition metal and the silicon in the thin film and a content of the nitrogen in the thin film are in ranges satisfying a condition of a formula (1) given by $$C_N \geq -0.00526 C_{Mo}^2 - 0.640 C_{Mo} + 26.624$$

where $C_{Mo}$ is the ratio obtained by dividing the content of the transition metal by the total content of the transition metal and the silicon and $C_N$ is the content of the nitrogen.

3. The mask blank according to claim 2, wherein the ratio obtained by dividing the content of the transition metal in the thin film by the total content of the transition metal and the silicon in the thin film and the content of the nitrogen in the thin film are in ranges simultaneously satisfying a condition of a formula (2) given by $$C_N \leq 2.97 \times 10^{-8} C_{Mo}^6 - 5.22 \times 10^{-6} C_{Mo}^5 + 3.39 \times 10^{-4} C_{Mo}^4 - 9.35 \times 10^{-3} C_{Mo}^3 + 4.19 \times 10^{-2} C_{Mo}^2 + 2.470 C_{Mo} + 9.531$$

where $C_{Mo}$ is the ratio obtained by dividing the content of the transition metal by the total content of the transition metal and the silicon and $C_N$ is the content of the nitrogen.

4. The mask blank according to claim 2, wherein the ratio obtained by dividing the content of the transition metal in the thin film by the total content of the transition metal and the silicon in the thin film and the content of the nitrogen in the thin film are in ranges simultaneously satisfying a condition of a formula (3) given by $$C_N \leq -3.63 \times 10^{-7} C_{Mo}^5 + 7.60 \times 10^{-5} C_{Mo}^4 - 4.67 \times 10^{-3} C_{Mo}^3 + 5.06 \times 10^{-2} C_{Mo}^2 + 2.082 C_{Mo} + 1.075$$

where $C_{Mo}$ is the ratio obtained by dividing the content of the transition metal by the total content of the transition metal and the silicon and $C_N$ is the content of the nitrogen.

5. The mask blank according to claim 2, wherein the ratio obtained by dividing the content of the transition metal in the thin film by the total content of the transition metal and the silicon in the thin film and the content of the nitrogen in the thin film are in ranges simultaneously satisfying a condition of a formula (4) given by $$C_N \leq 2.593 C_{Mo} - 24.074$$

where $C_{Mo}$ is the ratio obtained by dividing the content of the transition metal by the total content of the transition metal and the silicon and $C_N$ is the content of the nitrogen.

6. The mask blank according to claim 1,
wherein the etching rate of the thin film by the fluorine-containing substance in the state of not being irradiated with the charged particles is 0.1 nm/sec or less, and
wherein a ratio obtained by dividing a content of the transition metal in the thin film by a total content of the transition metal and the silicon in the thin film and a content of the nitrogen in the thin film are in ranges satisfying a condition of a formula (5) given by $$C_N \geq -0.00351 C_{Mo}^2 - 0.393 C_{Mo} + 32.086$$

where $C_{Mo}$ is the ratio obtained by dividing the content of the transition metal by the total content of the transition metal and the silicon and $C_N$ is the content of the nitrogen.

7. The mask blank according to claim 6, wherein the ratio obtained by dividing the content of the transition metal in the thin film by the total content of the transition metal and the silicon in the thin film and the content of the nitrogen in the thin film are in ranges simultaneously satisfying a condition of a formula (2) given by $$C_N \leq 2.97 \times 10^{-8} C_{Mo}^6 - 5.22 \times 10^{-6} C_{Mo}^5 + 3.39 \times 10^{-4} C_{Mo}^4 - 9.35 \times 10^{-3} C_{Mo}^3 + 4.19 \times 10^{-2} C_{Mo}^2 + 2.470 C_{Mo} + 9.531$$

where $C_{Mo}$ is the ratio obtained by dividing the content of the transition metal by the total content of the transition metal and the silicon and $C_N$ is the content of the nitrogen.

8. The mask blank according to claim 6, wherein the ratio obtained by dividing the content of the transition metal in the thin film by the total content of the transition metal and the silicon in the thin film and the content of the nitrogen in the thin film are in ranges simultaneously satisfying a condition of a formula (3) given by $$C_N \leq -3.63 \times 10^{-7} C_{Mo}^5 + 7.60 \times 10^{-5} C_{Mo}^4 - 4.67 \times 10^{-3} C_{Mo}^3 + 5.06 \times 10^{-2} C_{Mo}^2 + 2.082 C_{Mo} + 1.075$$

where $C_{Mo}$ is the ratio obtained by dividing the content of the transition metal by the total content of the transition metal and the silicon and $C_N$ is the content of the nitrogen.

9. The mask blank according to claim 6, wherein the ratio obtained by dividing the content of the transition metal in the thin film by the total content of the transition metal and the silicon in the thin film and the content of the nitrogen in the thin film are in ranges simultaneously satisfying a condition of a formula (4) given by $$C_N \leq 2.593 C_{Mo} - 24.074$$

where $C_{Mo}$ is the ratio obtained by dividing the content of the transition metal by the total content of the transition metal and the silicon and $C_N$ is the content of the nitrogen.

10. The mask blank according to claim 1, wherein the thin film has an at least two-layer structure of a lower layer and an upper layer.

11. The mask blank according to claim 10, wherein the thin film has a first etching rate of the lower layer by the fluorine-containing substance in a state of being irradiated with charged particles, a second etching rate of the upper layer by the fluorine-containing substance in the state of being irradiated with the charged particles, a third etching rate of the lower layer by the fluorine-containing substance in the state of not being irradiated with the charged particles, and a fourth etching rate of the upper layer by the fluorine-containing substance in the state of not being irradiated with the charged particles,
wherein the forth etching rate is lower than the third etching rate, the third etching rate is lower than the second etching rate, and the second etching rate is lower than the first etching rate.

12. The mask blank according to claim 10, wherein a total content of the nitrogen and the oxygen in the lower layer is 40 at % or less.

13. The mask blank according to claim 10, wherein a ratio obtained by dividing a content of the transition metal in the lower layer by a total content of the transition metal and the silicon in the lower layer is 6% or more.

14. The mask blank according to claim 10, wherein a ratio obtained by dividing a content of the transition metal in the lower layer by a total content of the transition metal and the silicon in the lower layer is 15% or more.

15. The mask blank according to claim 10, wherein a total content of the nitrogen and the oxygen in the upper layer is 30 at % or more.

16. The mask blank according to claim 10, wherein a content of the transition metal in the upper layer is 10 at % or less.

17. The mask blank according to claim 1, wherein an etching mask film is provided on an upper surface of the thin film and contains chromium and at least one of nitrogen and oxygen, a content of the chromium in the etching mask film is less than 50 at %, and a thickness of the etching mask film is 5 nm or more and 20 nm or less.

18. A transfer mask manufactured using the mask blank according to claim 1.

19. A method of manufacturing a transfer mask using the mask blank according to claim 1, comprising:
etching step of patterning the thin film by etching; and
defect correction step of etching a black detect portion of the thin film by supplying the fluorine-containing substance and irradiating the charged particles to the black detect portion.

20. A method manufacturing the transfer mask according to claim 19, wherein the defect correction step is performed to reduce an etching rate of a lower layer of the thin film by supplying water or vapor upon etching the lower layer.

21. A transfer mask, comprising;
a transparent substrate;
a thin film formed on the transparent substrate, the thin film having a transfer pattern;
wherein the thin film is composed of a material containing a transition metal, silicon, and at least one or more elements selected from oxygen and nitrogen, and
wherein an etching rate of the thin film by a fluorine-containing substance in a state of not being irradiated with charged particles is 0.3 nm/sec or less.

22. The transfer mask according to claim 21, wherein a ratio obtained by dividing a content of the transition metal in the thin film by a total content of the transition metal and the silicon in the thin film and a content of the nitrogen in the thin film are in ranges satisfying a condition of a formula (1) given by $$C_N \geq -0.00526 C_{Mo}^2 - 0.640 C_{Mo} + 26.624$$

where $C_{Mo}$ is the ratio obtained by dividing the content of the transition metal by the total content of the transition metal and the silicon and $C_N$ is the content of the nitrogen.

23. The transfer mask according to claim 21, wherein the ratio obtained by dividing the content of the transition metal in the thin film by the total content of the transition metal and the silicon in the thin film and the content of the nitrogen in the thin film are in ranges simultaneously satisfying a condition of a formula (2) given by $$C_N \leq 2.97 \times 10^{-8} C_{Mo}^6 - 5.22 \times 10^{-6} C_{Mo}^5 + 3.39 \times 10^{-4} C_{Mo}^4 - 9.35 \times 10^{-3} C_{Mo}^3 + 4.19 \times 10^{-2} C_{Mo}^2 + 2.470 C_{Mo} + 9.531$$

where $C_{Mo}$ is the ratio obtained by dividing the content of the transition metal by the total content of the transition metal and the silicon and $C_N$ is the content of the nitrogen.

24. The transfer mask according to claim 21, wherein the ratio obtained by dividing the content of the transition metal in the thin film by the total content of the transition metal and the silicon in the thin film and the content of the nitrogen in the thin film are in ranges simultaneously satisfying a condition of a formula (3) given by $$C_N \leq -3.63 \times 10^{-7} C_{Mo}^5 + 7.60 \times 10^{-5} C_{Mo}^4 - 4.67 \times 10^{-3} C_{Mo}^3 + 5.06 \times 10^{-2} C_{Mo}^2 + 2.082 C_{Mo} + 1.075$$

where $C_{Mo}$ is the ratio obtained by dividing the content of the transition metal by the total content of the transition metal and the silicon and $C_N$ is the content of the nitrogen.

25. The transfer mask according to claim 21, wherein the ratio obtained by dividing the content of the transition metal in the thin film by the total content of the transition metal and the silicon in the thin film and the content of the nitrogen in the thin film are in ranges simultaneously satisfying a condition of a formula (4) given by $$C_N \leq 2.593 C_{Mo} - 24.074$$

where $C_{Mo}$ is the ratio obtained by dividing the content of the transition metal by the total content of the transition metal and the silicon and $C_N$ is the content of the nitrogen.

26. The transfer mask according to claim 21, wherein the etching rate of the thin film by the fluorine-containing substance in the state of not being irradiated with the charged particles is 0.1 nm/sec or less, and
wherein a ratio obtained by dividing a content of the transition metal in the thin film by a total content of the transition metal and the silicon in the thin film and a content of the nitrogen in the thin film are in ranges satisfying a condition of a formula (5) given by $$C_N \geq -0.00351 C_{Mo}^2 - 0.393 C_{Mo} + 32.086$$

where $C_{Mo}$ is the ratio obtained by dividing the content of the transition metal by the total content of the transition metal and the silicon and $C_N$ is the content of the nitrogen.

27. The transfer mask according to claim 26, wherein the ratio obtained by dividing the content of the transition metal in the thin film by the total content of the transition metal and the silicon in the thin film and the content of the nitrogen in the thin film are in ranges simultaneously satisfying a condition of a formula (2) given by $$C_N \leq 2.97 \times 10^{-8} C_{Mo}^6 - 5.22 \times 10^{-6} C_{Mo}^5 + 3.39 \times 10^{-4} C_{Mo}^4 - 9.35 \times 10^{-3} C_{Mo}^3 + 4.19 \times 10^{-2} C_{Mo}^2 + 2.470 C_{Mo} + 9.531$$

where $C_{Mo}$ is the ratio obtained by dividing the content of the transition metal by the total content of the transition metal and the silicon and $C_N$ is the content of the nitrogen.

28. The transfer mask according to claim 26, wherein the ratio obtained by dividing the content of the transition metal in the thin film by the total content of the transition metal and the silicon in the thin film and the content of the nitrogen in the thin film are in ranges simultaneously satisfying a condition of a formula (3) given by $$C_N \leq -3.63 \times 10^{-7} C_{Mo}^5 + 7.60 \times 10^{-5} C_{Mo}^4 - 4.67 \times 10^{-3} C_{Mo}^3 + 5.06 \times 10^{-2} C_{Mo}^2 + 2.082 C_{Mo} + 1.075$$

where $C_{Mo}$ is the ratio obtained by dividing the content of the transition metal by the total content of the transition metal and the silicon and $C_N$ is the content of the nitrogen.

29. The transfer mask according to claim 26, wherein the ratio obtained by dividing the content of the transition metal in the thin film by the total content of the transition metal and the silicon in the thin film and the content of the nitrogen in the thin film are in ranges simultaneously satisfying a condition of a formula (4) given by $$C_N \leq 2.593 C_{Mo} - 24.074$$

where $C_{Mo}$ is the ratio obtained by dividing the content of the transition metal by the total content of the transition metal and the silicon and $C_N$ is the content of the nitrogen.

* * * * *